(12) United States Patent
Yoshikawa et al.

(10) Patent No.: US 10,304,509 B2
(45) Date of Patent: May 28, 2019

(54) MAGNETIC STORAGE DEVICE

(71) Applicant: TOSHIBA MEMORY CORPORATION, Minato-ku, Tokyo (JP)

(72) Inventors: Masatoshi Yoshikawa, Seoul (KR); Kuniaki Sugiura, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/702,155

(22) Filed: Sep. 12, 2017

(65) Prior Publication Data

US 2018/0261270 A1    Sep. 13, 2018

(30) Foreign Application Priority Data

Mar. 10, 2017    (JP) ................. 2017-046567

(51) Int. Cl.
| | |
|---|---|
| *G11C 11/16* | (2006.01) |
| *H01L 43/02* | (2006.01) |
| *H01L 43/08* | (2006.01) |
| *H01L 27/22* | (2006.01) |
| *H01L 23/528* | (2006.01) |
| *H01L 43/10* | (2006.01) |

(52) U.S. Cl.
CPC ........ *G11C 11/161* (2013.01); *G11C 11/1659* (2013.01); *G11C 11/1675* (2013.01); *H01L 27/224* (2013.01); *H01L 43/02* (2013.01); *H01L 43/08* (2013.01); *H01L 23/528* (2013.01); *H01L 43/10* (2013.01)

(58) Field of Classification Search
CPC .... G11C 11/161; G11C 11/1675; H01L 43/02
USPC .......................................... 365/158
See application file for complete search history.

(56) References Cited

U.S. PATENT DOCUMENTS

| | | | |
|---|---|---|---|
| 8,233,319 B2 | 7/2012 | Lou et al. | |
| 2004/0170055 A1* | 9/2004 | Albert | G11C 11/16 365/173 |
| 2005/0020011 A1 | 1/2005 | Nakajima et al. | |
| 2005/0190594 A1* | 9/2005 | Nakamura | B82Y 25/00 365/171 |
| 2010/0080036 A1* | 4/2010 | Liu | G11C 11/16 365/145 |

(Continued)

FOREIGN PATENT DOCUMENTS

| | | |
|---|---|---|
| JP | 5062538 B2 | 10/2012 |
| JP | 2013175680 A | 9/2013 |

(Continued)

*Primary Examiner* — Vu A Le
(74) *Attorney, Agent, or Firm* — Holtz, Holtz & Volek PC

(57) ABSTRACT

According to an embodiment, a magnetic storage device includes a memory cell including a magnetoresistive element, a selector, a first end, and a second end. The magnetoresistive element includes a first ferromagnetic layer, a second ferromagnetic layer, a third ferromagnetic layer, a first nonmagnetic layer disposed between the first ferromagnetic layer and the second ferromagnetic layer, and a second nonmagnetic layer disposed between the second ferromagnetic layer and the third ferromagnetic layer to couple the second ferromagnetic layer with the third ferromagnetic layer in an antiferromagnetic manner. The first ferromagnetic layer has a film thickness larger than a film thickness of the second ferromagnetic layer.

19 Claims, 17 Drawing Sheets

(56) References Cited

U.S. PATENT DOCUMENTS

| | | |
|---|---|---|
| 2010/0284217 A1 | 11/2010 | Ogimoto et al. |
| 2011/0222333 A1 | 9/2011 | Ito |
| 2011/0228596 A1* | 9/2011 | Inokuchi ........... H01L 29/66984 365/158 |
| 2011/0316102 A1 | 12/2011 | Ohmori et al. |

FOREIGN PATENT DOCUMENTS

| | | |
|---|---|---|
| TW | 200509366 A | 3/2005 |
| TW | 201014003 A | 4/2010 |
| TW | 201209817 A | 3/2012 |

\* cited by examiner

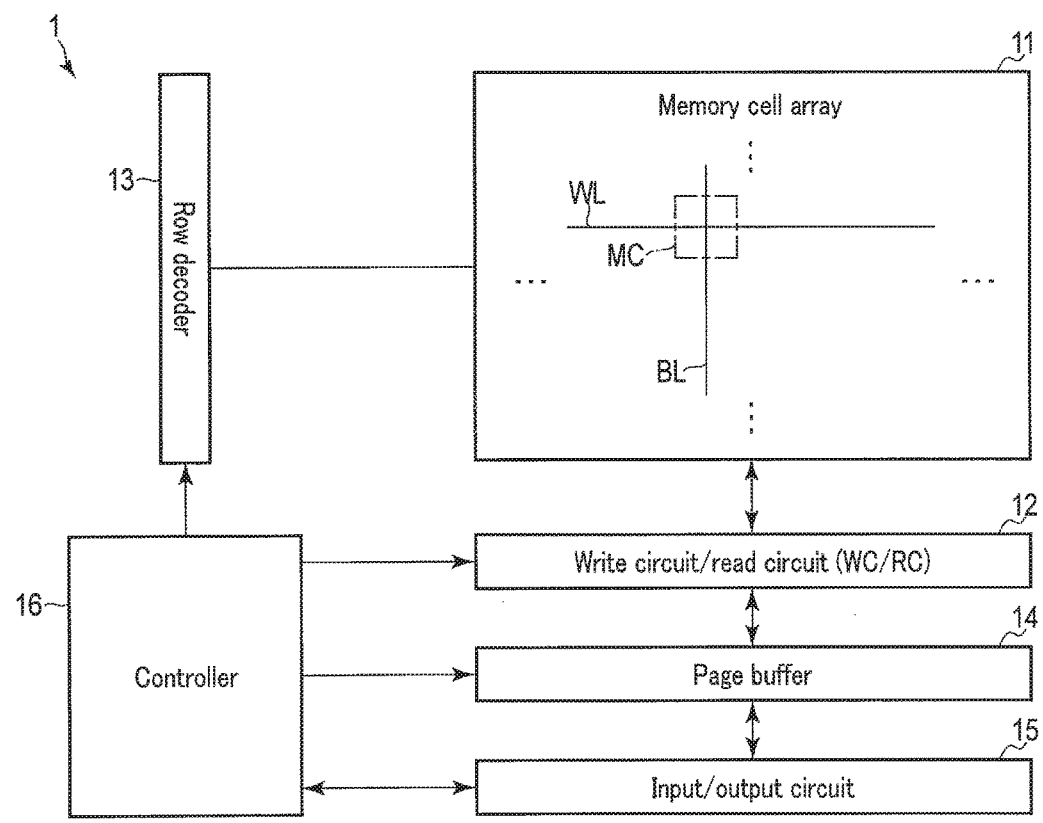
F I G. 1

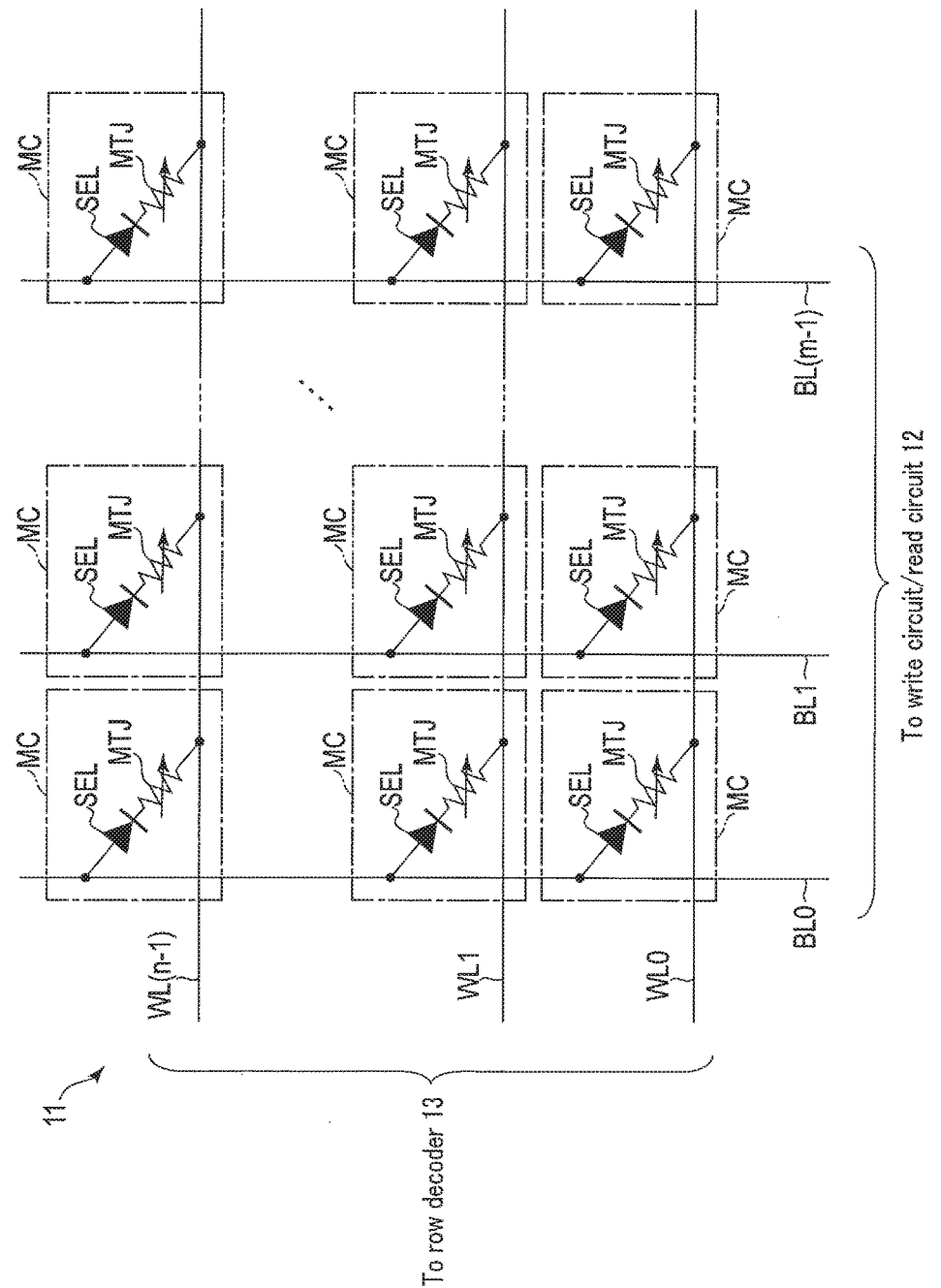
F I G. 2

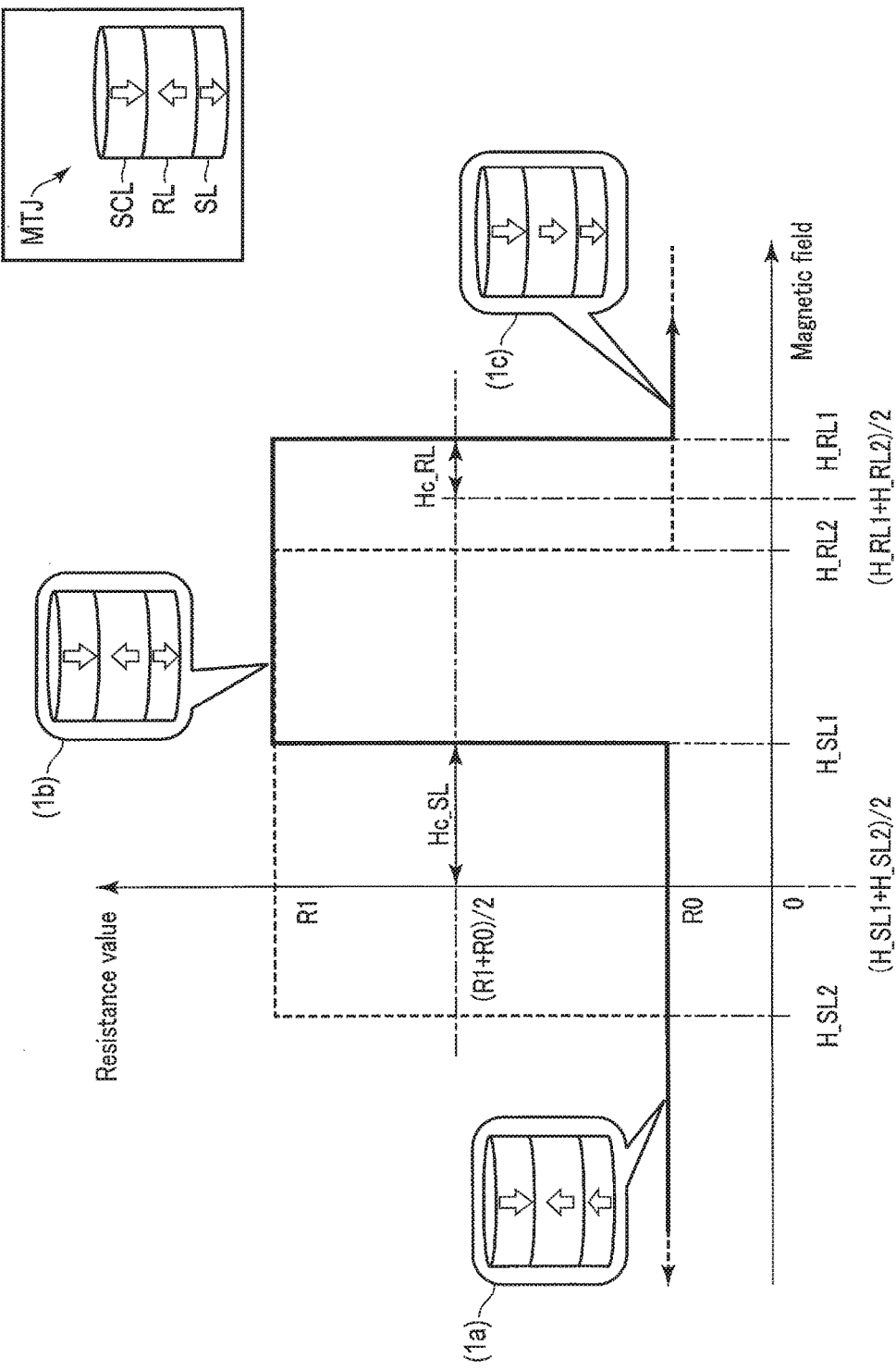
F I G. 5

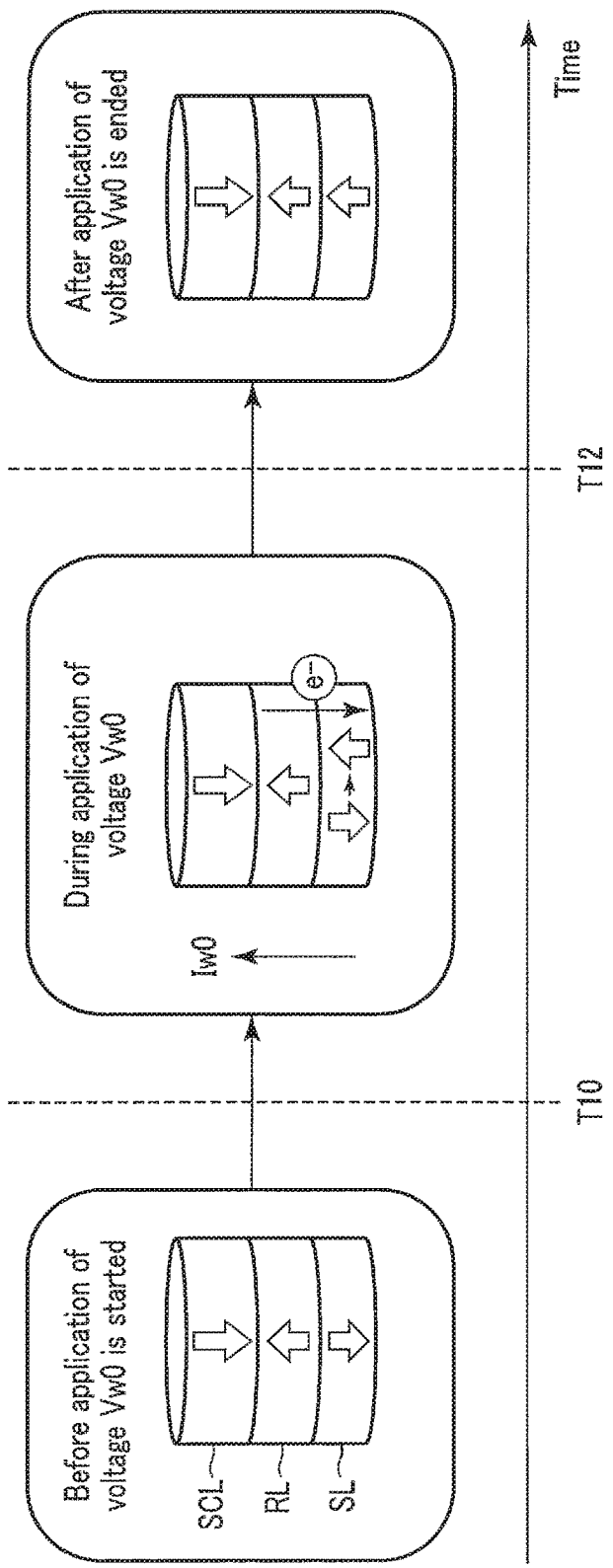
F I G. 8

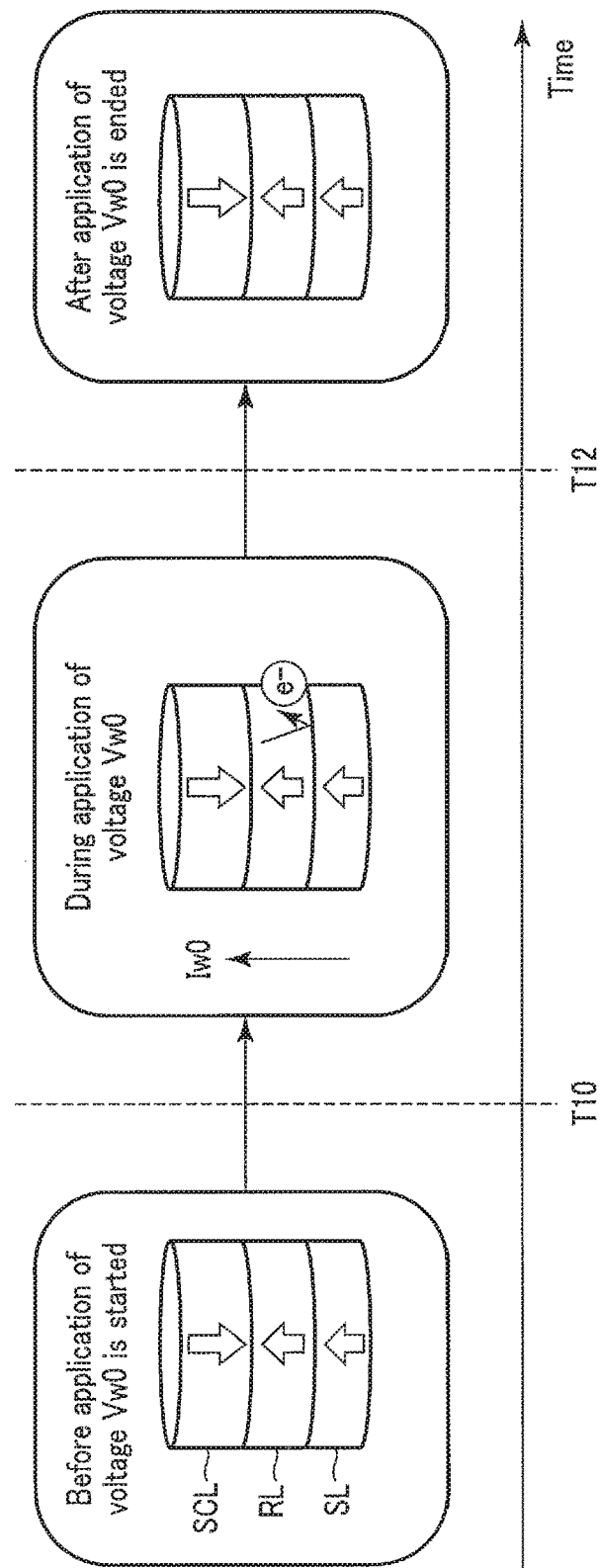
F I G. 9

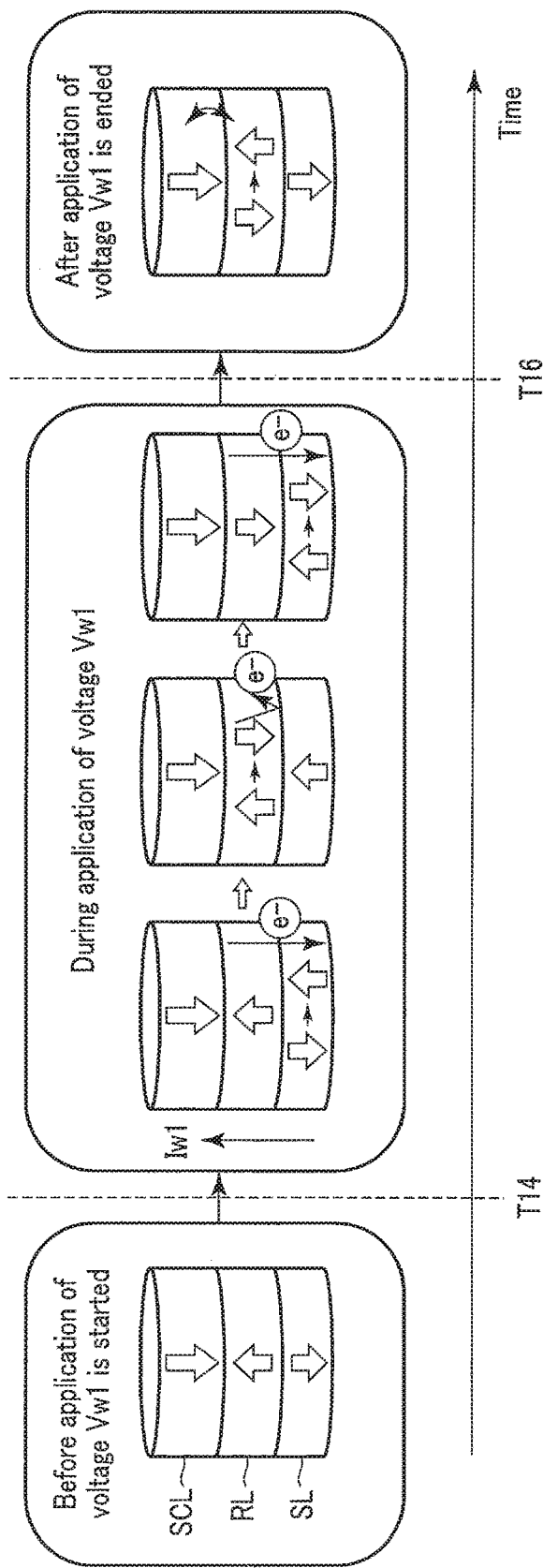
F I G. 11

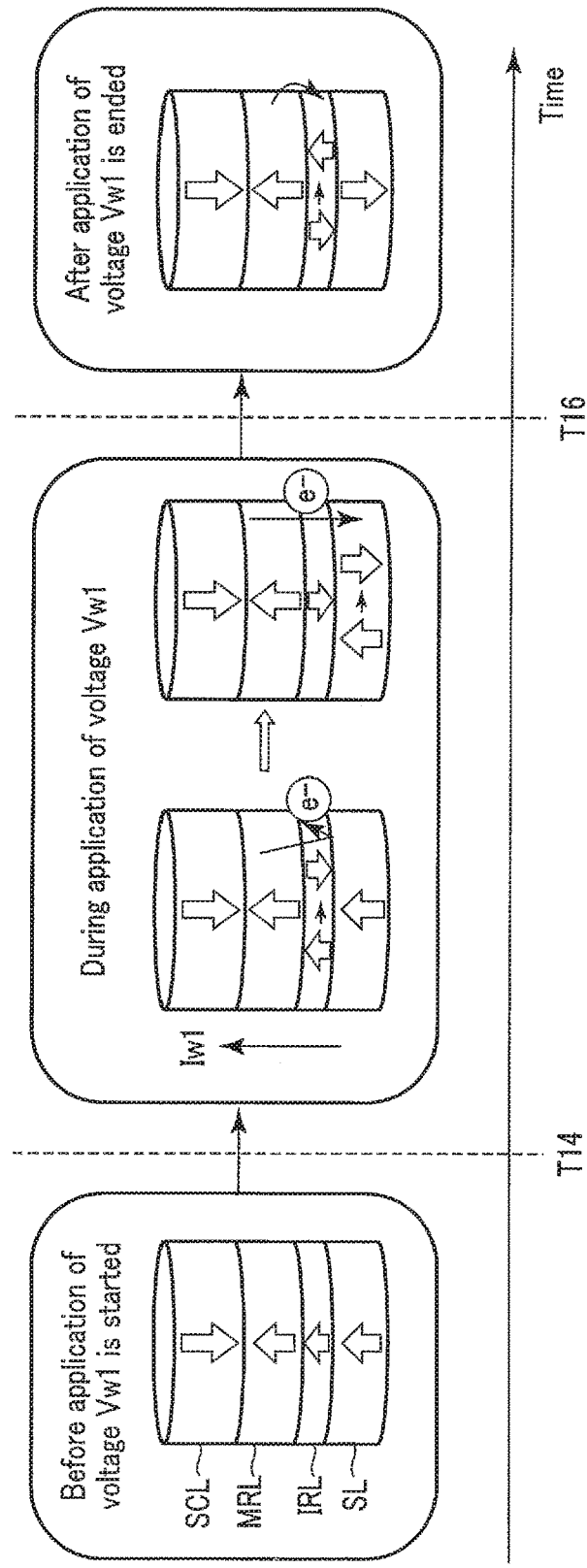
F I G. 13

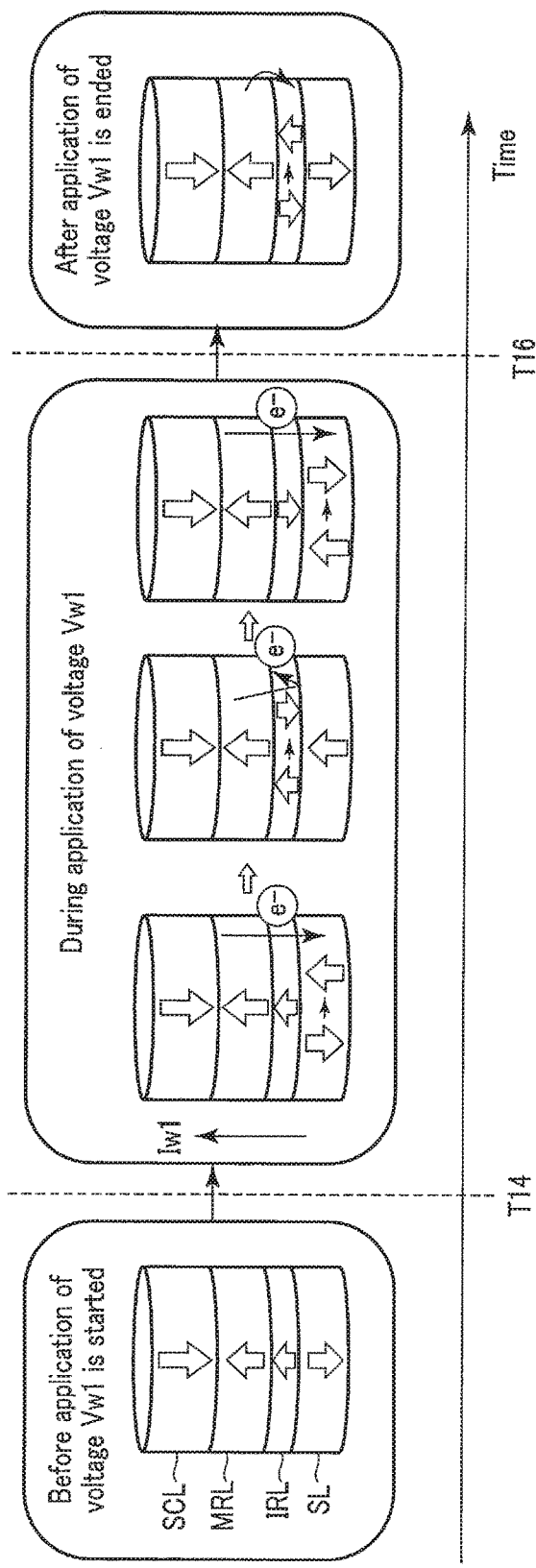
F I G. 14

MAGNETIC STORAGE DEVICE

CROSS-REFERENCE TO RELATED APPLICATIONS

This application is based upon and claims the benefit of priority from prior Japanese Patent Application No. 2017-046567, filed Mar. 10, 2017, the entire contents of which are incorporated herein by reference.

FIELD

Embodiments described herein relate generally to a magnetic storage device.

BACKGROUND

Magnetic storage devices (MRAM: Magnetoresistive Random Access Memory) using magnetoresistive elements as storage elements are known.

BRIEF DESCRIPTION OF THE DRAWINGS

FIG. 1 is a block diagram for explaining a structure of a magnetic storage device according to a first embodiment;

FIG. 2 is a circuit diagram for explaining a structure of a memory cell array of the magnetic storage device according to the first embodiment;

FIG. 5 is a diagram for explaining magnetoresistive characteristic of the magnetoresistive element of the magnetic storage device according to the first embodiment;

FIG. 8 is a schematic diagram for explaining an operation of writing data "0" in the magnetic storage device according to the first embodiment;

FIG. 9 is a schematic diagram for explaining an operation of writing data "0" in the magnetic storage device according to the first embodiment;

FIG. 11 is a schematic diagram for explaining an operation of writing data "1" in the magnetic storage device according to the first embodiment;

FIG. 13 is a schematic diagram for explaining an operation of writing data "1" in the magnetic storage device according to the second embodiment;

FIG. 14 is a schematic diagram for explaining an operation of writing data "0" in the magnetic storage device according to the second embodiment;

DETAILED DESCRIPTION

Figure 3:
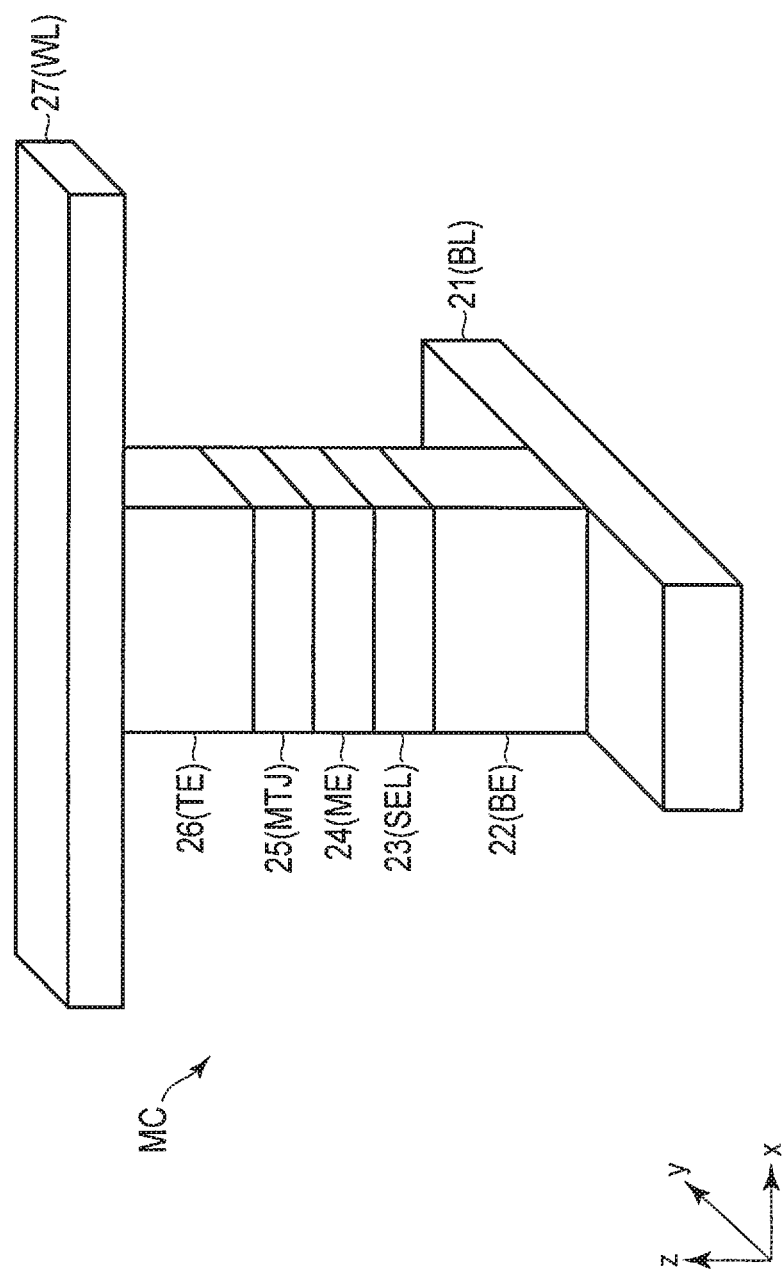
FIG. 3 is a perspective view for explaining a memory cell of the magnetic storage device according to the first embodiment.

In general, according to one embodiment, a magnetic storage device includes a memory cell includes a magnetoresistive element, a selector electrically connected with the magnetoresistive element, a first end electrically connected to a bit line, and a second end electrically connected to a word line. The magnetoresistive element includes a first ferromagnetic layer, a second ferromagnetic layer, a third ferromagnetic layer, a first nonmagnetic layer disposed between the first ferromagnetic layer and the second ferromagnetic layer, and a second nonmagnetic layer disposed between the second ferromagnetic layer and the third ferromagnetic layer to couple the second ferromagnetic layer with the third ferromagnetic layer in an antiferromagnetic manner. The first ferromagnetic layer has a film thickness larger than a film thickness of the second ferromagnetic layer.

Embodiments will be described below with reference to the accompanying drawings. Note that in the following description, common reference numerals denote components having the same functions and configurations. To discriminate between a plurality of components having a common reference numeral, subscripts are added to the common reference numeral. Note that if is not necessary to specifically discriminate between the plurality of components, the common reference numeral without any subscripts denotes the plurality of components.

1. First Embodiment

The following is explanation of a magnetic storage device according to a first embodiment. The magnetic storage device according to the first embodiment is, for example, a magnetic storage device by a perpendicular magnetization method using magnetoresistive (magnetic tunnel junction: MTJ) elements as storage elements.

1.1 Structure

First, the following is explanation of the magnetic storage device according to the first embodiment.

1.1.1 Structure of Magnetic Storage Device

FIG. 1 is a block diagram illustrating a structure of the magnetic storage device according to the first embodiment. As illustrated in FIG. 1, the magnetic storage device 1 includes a memory cell array 11, a write circuit and a read circuit (WC/RC) 12, a row decoder 13, a page buffer 14, an input/output circuit 15, and a controller 16.

The memory cell array 11 includes a plurality of memory cells MC associated with rows and columns. Memory cells MC located in the same row are connected to the same word line WL, and memory cells MC located in the same column are connected to the same bit line BL.

The WC/RC 12 is connected with the memory cell array 11 via bit lines BL. The WC/RC 12 supplies current to the memory cell MC serving as the operation target through the bit line BL, to perform write and read of data to and from the memory cell MC. More specifically, the write circuit of the WC/RC 12 writes data to the memory cell MC, and the read circuit of the WC/RC 12 reads data from the memory cell MC.

The row decoder 13 is connected with the memory cell array 11 through word lines WL. The row decoder 13 decodes a row address designating the row direction of the memory cell array 11. The row decoder 13 selects a word line WL in accordance with the decoding result, and applies a voltage necessary for an operation, such as write and read of data, to the selected word line WL.

The page buffer 14 temporarily holds data to be written to the memory cell array 11, and data read from the memory cell array 11, in the data unit called "page".

The input/output circuit 15 transmits various signals received from the outside of the magnetic storage device 1 to the controller 16 and the page buffer 14, and transmits various signals from the controller 16 and the page buffer 14 to the outside of the magnetic storage device 1.

The controller 16 is connected with the WC/RC 12, the row decoder 13, the page buffer 14, and the input/output circuit 15. The controller 16 controls the WC/RC 12, the row decoder 13, and the page buffer 14, in accordance with various signals received with the input/output circuit 15 from the outside of the magnetic storage device 1.

1.1.2 Structure of Memory Cell Array

The following is explanation of a structure of the memory cell array of the magnetic storage device according to the first embodiment, with reference to FIG. 2. FIG. 2 is a circuit diagram illustrating a structure of the memory cell array of the magnetic storage device according to the first embodiment.

As illustrated in FIG. 2, the memory cells MC are arranged in a matrix manner in the memory cell array 11, and each of the memory cells MC is associated with a pair of one of m bit lines BL (BL0, BL1, . . . , BL (m−1) (m is a natural number)) and on of n word lines WL (WL0, WL1, . . . , WL (n−1) (n is a natural number)). Specifically, the first end of a memory cell MC is connected with one of m bit lines BL, and the second end of the memory cell MC is connected with one of n word lines WL. The first ends of memory cells MC in the same column are connected with the same bit line BL in common. The second ends of memory cells MC in the same row are connected with the same word line WL in common.

Each of the memory cells MC includes a selector SEL and a magnetoresistive element MTJ connected in series. More specifically, the selector SEL includes an input end and an output end, and the magnetoresistive element MTJ includes a first end and a second end. The output end of the selector SEL is electrically connected with the first end of the magnetoresistive element MTJ. In the example of FIG. 3, the input end of the selector SEL corresponds to the first end of the memory cell MC, and the second end of the magnetoresistive element MTJ corresponds to the second end of the memory cell MC.

The selector SEL has a function as switch controlling supply of a current to the magnetoresistive element MTJ, in data write and read to and from the magnetoresistive element MTJ. More specifically, for example, the selector SEL in a memory cell MC transmits a current flowing from the bit line BL to the word line WL corresponding to the memory cell MC, and shuts off a current flowing from the word line WL to the bit line BL corresponding to the memory cell MC. Specifically, the selector SEL has a rectifying function to transmitting a current flowing from one direction to the other direction, and shutting off a current flowing from the other direction to one direction.

The selector SEL may be, for example, an oxide-PN junction element, a metal-oxide Schottky diode element, a MIM (metal-insulator-metal) diode element, a MSM (metal-semiconductor-metal) diode element, or an OTS (ovonic threshold switch) element, but is not limited thereto. Any element having a rectifying function as described above may be applied to the selector SEL.

The magnetoresistive element MTJ has a resistance value switchable between a low-resistance state and a high-resistance state, with a current, supply of which is controlled with the selector SEL. The magnetoresistive element MTJ functions as a storage element to which data is writable by change of its resistance state, capable of holding the written data in a nonvolatile manner, and from which the written data is readable.

With the structure described above, the memory cell array 11 has a cross-point structure in which one memory cell MC is selectable by selecting a pair of one bit line BL and one word line WL.

1.1.3 Structure of Memory Cells

The following is explanation of a structure of each memory cell of the magnetic storage device according to the first embodiment, with reference to FIG. 3. In the following explanation, suppose that the magnetic storage device 1 is provided on a semiconductor substrate that is not illustrated. A plane parallel with the upper surface of the semiconductor substrate is defined as xy plane, and an axis perpendicular to the xy plane is defined as z axis. In the following explanation, a z-axis direction is also referred to as a film thickness direction, and x axis and a y axis are defined as axes orthogonal to each other in the xy plane.

FIG. 3 is a perspective view for schematically explaining an example of a three-dimensional structure of each of the memory cells of the magnetic storage device according to the first embodiment. As illustrated in FIG. 3, for example, each of the memory cells MC is interposed between a wiring layer 21 functions as the bit line BL and a wiring layer 27 functioning as the word line WL. The wiring layers 21 and 27 extend, for example, in the y-axis direction and the x-axis direction, respectively. Each memory cell MC includes a conductive layer 22, an element layer 23, a conductive layer 24, an element layer 25, and a conductive layer 26.

The conductive layer 22 functioning as bottom electrode BE is provided on the upper surface of the wiring layer 21. The conductive layer 22 includes, for example, tantalum (Ta), tungsten (W), titanium nitride (TiN), and tantalum nitride (TaN).

The element layer (for example, semiconductor layer) 23 functioning as the selector SEL is provided on the upper surface of the conductive layer 22.

The conductive layer 24 functioning as middle electrode ME is provided on the upper surface of the element layer 23. The conductive layer 24 includes, for example, tantalum (Ta), tungsten (W), titanium nitride (TiN), and tantalum nitride (TaN).

The element layer 25 functioning as the magnetoresistive element MTJ is provided on the upper surface of the conductive layer 24. The details of the element layer 25 will be described later.

The conductive layer 26 functioning as top electrode TE is provided on the upper surface of the element layer 25. The conductive layer 26 includes, for example, tantalum (Ta), tungsten (W), titanium nitride (TiN), tantalum nitride (TaN), and titanium (Ti). The wiring layer 27 is provided on the upper surface of the conductive layer 26.

A plurality of other memory cells MC (not illustrated) provided along the y axis are provided on the upper surface of the wiring layer 21. A plurality of other memory cells MC (not illustrated) provided along the x-axis direction are provided together on the lower surface of the wiring layer 27.

1.1.4 Structure of Magnetoresistive Element

Figure 4:
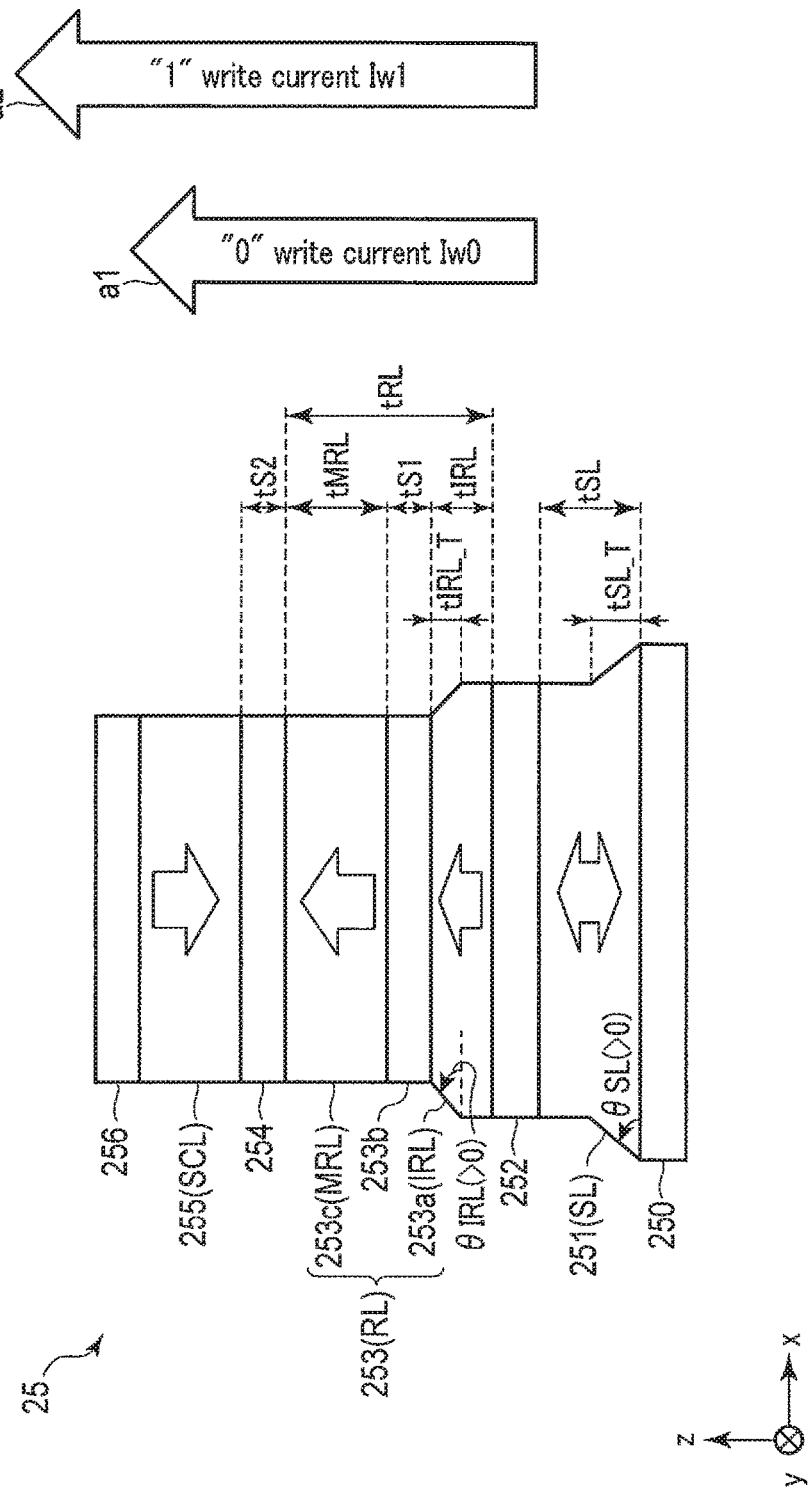
FIG. 4 is a cross-sectional view for explaining a structure of a magnetoresistive element of the magnetic storage device according to the first embodiment.

The following is explanation of a structure of each of magnetoresistive elements of the magnetic storage device according to the first embodiment, with reference to FIG. 4. FIG. 4 is an example of a cross-sectional view of a memory cell of the magnetic storage device according to the first embodiment, taken along the xz plane.

As illustrated in FIG. 4, the element layer 25 includes a nonmagnetic layer 250 functioning as under layer, a ferromagnetic layer 251 functioning as storage layer SL, a nonmagnetic layer 252 functioning as tunnel barrier layer, a ferromagnetic layer 253 functioning as reference layer RL, a nonmagnetic layer 254 functioning as spacer layer, a ferromagnetic layer 255 functioning as shift cancelling layer SCL, and a nonmagnetic layer 256 functioning as cap layer. The ferromagnetic layer 251, the nonmagnetic layer 252, and the ferromagnetic layer 253 form magnetic tunnel junction.

The element layer 25 has a structure in which a plurality of films are layered in the z-axis direction, for example, in the order of the nonmagnetic layer 250, the ferromagnetic layer 251, the nonmagnetic layer 252, the ferromagnetic layer 253, the nonmagnetic layer 254, the ferromagnetic layer 255, and the nonmagnetic layer 256, from the bit line BL side. The element layer 25 functions as perpendicular magnetization MTJ element in which the magnetization orientations of the ferromagnetic layers 251, 253, and 255 are directed in the perpendicular direction with respect to the film surface.

The nonmagnetic layer 250 is a nonmagnetic film, and includes a nitrogen compound or an oxygen compound, such as magnesium oxide (MgO), a magnesium nitride (MgN), zirconium nitride (ZrN), niobium nitride (NbN), silicon nitride (SiN), aluminum nitride (AlN), hafnium nitride (HfN), tantalum nitrude (TaN), tungsten nitride (WN), chromium nitride (CrN), molybdenum nitride (MoN), titanium nitride (TiN), and vanadium nitride (VN). The nonmagnetic layer 250 may include a mixture of the nitrogen compound and the oxygen compound described above. Specifically, the nonmagnetic layer 250 may include a ternary compound formed of three types of chemical elements, such as aluminum titanium nitride (AlTiN), as well as a binary compound formed of two types of chemical elements. The nitride compound and the oxygen compound suppress increase in damping constant of the magnetic layer contacting them, and produce the effect of reduction in write current. In addition, using a nitride compound or oxygen compound of metal with high melting point suppresses diffusion of the under layer material into the magnetic layer, and prevents deterioration in MR ratio. The metal with high melting point herein means material with higher melting point than that of iron (Fe) and cobalt (Co), such as zirconium (Zr), hafnium (Hf), tungsten (W), chromium (Cr), molybdenum (Mo), niobium (Nb), titanium (Ti), tantalum (Ta), and vanadium (V).

The ferromagnetic layer 251 has ferromagnetism, and has an easy axis of magnetization in a direction perpendicular to the film surface. The ferromagnetic layer 251 has a magnetization orientation going toward one of the bit line BL side and the word line WL side. The ferromagnetic layer 251 includes, for example, cobalt iron boron (CoFeB) or iron boride (FeB), and has a film thickness tSL in the z-axis direction.

The ferromagnetic layer 251 has, for example, an area of the upper surface smaller than the area of the lower surface. More specifically, the ferromagnetic layer 251 has a cross-sectional area of a cross section along the xy plane including a portion gradually narrowing along the z-axis direction. Specifically, the cross section of the ferromagnetic layer 251 perpendicular to the xy plane includes, for example, a portion having a trapezoidal shape in which the length of the upper base is shorter than the length of the lower base. Specifically, the ferromagnetic layer 251 includes a portion tapered with a taper angle $\theta SL$ ($\theta > 0$). In the ferromagnetic layer 251, the portion tapered with the taper angle $\theta SL$ has a film thickness $tSL\_T$. The tapered portion of the ferromagnetic layer 251 is provided, for example, in the vicinity of the interface between the ferromagnetic layer 251 and the nonmagnetic layer 250.

The example of FIG. 4 illustrates the example in which a cross section of the ferromagnetic layer 251 perpendicular to the xy plane linearly changes along the z-axis direction, but the structure is not limited thereto. For example, a cross section of the ferromagnetic layer 251 perpendicular to the xy plane may nonlinearly change along the z-axis direction.

The nonmagnetic layer 252 is a nonmagnetic insulating film, and includes, for example, magnesium oxide (MgO).

The ferromagnetic layer 253 has ferromagnetism, has an easy axis of magnetization in a direction perpendicular to the film thickness, and has a film thickness tRL in the z-axis direction. More specifically, the ferromagnetic layer 253 includes a ferromagnetic layer 253a functioning as interface reference layer IRL, a nonmagnetic layer 253b functioning as spacer layer, and a ferromagnetic layer 253c functioning as main reference layer MRL. The ferromagnetic layer 253 has a structure in which plurality of films are layered in the z-axis direction, for example, in the order of the ferromagnetic layer 253a, the nonmagnetic layer 253b, and the ferromagnetic layer 253c from the ferromagnetic layer 251 side. The ferromagnetic layer 253a, the nonmagnetic layer 253b, and the ferromagnetic layer 253c have film thicknesses tIRL, tS1, and tMRL, respectively, in the z-axis direction. Specifically, the film thickness tRL includes the film thicknesses tIRL, tS1, and tMRL.

The ferromagnetic layer 253a has ferromagnetism, and has an easy axis of magnetization in a direction perpendicular to the film surface. The ferromagnetic layer 253a has magnetization orientation going toward one of the bit line BL side and the word line WL side. The ferromagnetic layer 253a includes a compound including, for example, a chemical element selected from cobalt, iron, and nickel (Ni), and a chemical element selected from boron (B), phosphor (P), carbon (C), and nitrogen (N).

The ferromagnetic layer 253a has, for example, an area of the upper surface smaller than the area of the lower surface. More specifically, the ferromagnetic layer 253a has a cross-sectional area of a cross section along the xy plane including a portion gradually narrowing along the z-axis direction. Specifically, the cross section of the ferromagnetic layer 253a perpendicular to the xy plane includes, for example, a portion having a trapezoidal shape in which the length of the upper base is shorter than the length of the lower base. Specifically, the ferromagnetic layer 253a includes a portion tapered with a taper angle $\theta IRL$ ($\theta > 0$). In the ferromagnetic layer 253a, the portion tapered with the taper angle $\theta IRL$ has a film thickness $tIRL\_T$. The tapered portion of the ferromagnetic layer 253a is provided, for example, in the vicinity of the interface between the ferromagnetic layer 253a and the nonmagnetic layer 253b.

The example of FIG. 4 illustrates the example in which a cross section of the ferromagnetic layer 253a perpendicular to the xy plane linearly changes along the z-axis direction, but the structure is not limited thereto. For example, a cross section of the ferromagnetic layer 253a perpendicular to the xy plane may nonlinearly change along the z-axis direction.

The nonmagnetic layer 253b is a nonmagnetic conductive film, and includes, for example, tantalum (Ta), hafnium (Hf), tungsten (W), zirconium (Zr), molybdenum (Mo), niobium (Nb), or titanium (Ti).

The ferromagnetic layer 253c has ferromagnetism, and has an easy axis of magnetization in a direction perpendicular to the film surface. The ferromagnetic layer 253c has magnetization orientation going toward one of the bit line BL side and the word line WL side. The ferromagnetic layer 253c includes, for example, a cobalt platinum (CoPt), cobalt nickel (CoNi), or cobalt palladium (CoPd). The ferromagnetic layer 253c includes, for example, a multilayer film of the compound described above. Specifically, for example, the ferromagnetic layer 253c includes a multilayer film (Co/Pt multilayer film) of cobalt (Co) and platinum (Pt), a multilayer film (Co/Ni multilayer film) of cobalt (Co) and nickel (Ni), or a multilayer film (Co/Pd multilayer film) of cobalt (Co) and palladium (Pd).

The ferromagnetic layer 253a and the ferromagnetic layer 253c are coupled with each other in a ferromagnetic manner with the nonmagnetic layer 253b. Specifically, the ferromagnetic layer 253a and the ferromagnetic layer 253c are coupled to have magnetization orientations parallel with each other, when no influence by an external magnetic field exists. In the following explanation, ferromagnetic coupling between the ferromagnetic layer 253a and the ferromagnetic layer 253c will be simply referred to as "ferromagnetic coupling".

The intensity of ferromagnetic coupling is indicated with, for example, the absolute value |Jex1| of coupling energy Jex1 per unit area of ferromagnetic coupling between the ferromagnetic layer 253a and the ferromagnetic layer 253c. Because the coupling is ferromagnetic coupling, the coupling energy Jex1 has a numerical value more than "0" (Jex1>0). The intensity |Jex1| of ferromagnetic coupling changes according to the thickness of the film thickness tS1 of the nonmagnetic layer 253b. The intensity |Jex1| of ferromagnetic coupling monotonously increases, for example, as the film thickness tS1 reduces.

The nonmagnetic layer 254 is a nonmagnetic conductive film, and includes, for example, ruthenium (Ru), osmium (Os), iridium (Ir), vanadium (V), or chromium (Cr). The nonmagnetic layer 254 has a film thickness tS2.

The ferromagnetic layer 255 has ferromagnetism, and has an easy axis of magnetization in a direction perpendicular to the film surface. The ferromagnetic layer 255 includes, for example, a cobalt platinum alloy (CoPt), cobalt nickel alloy (CoNi), or cobalt palladium alloy (CoPd). The ferromagnetic layer 255 includes, for example, a multilayer film (Co/Pt multilayer film) of cobalt (Co) and platinum (Pt), a multilayer film (Co/Ni multilayer film) of cobalt (Co) and nickel (Ni), or a multilayer film (Co/Pd multilayer film) of cobalt (Co) and palladium (Pd). The frequency of the multilayer film of the compound included in the ferromagnetic layer 255 is larger than, for example, the frequency of the multilayer film of the compound included in the ferromagnetic layer 253c. The ferromagnetic layer 255 has a magnetization orientation going toward one of the bit line BL side and the word line WL side. The magnetization orientation of the ferromagnetic layer 255 is fixed, and directed toward the ferromagnetic layer 253 in the example of FIG. 4. The expression "the magnetization orientation is fixed" means that the magnetization orientation is not changed with a current (spin torque) of the intensity capable of inverting the magnetization orientation of the ferromagnetic layer 251.

The ferromagnetic layer 253c and the ferromagnetic layer 255 are coupled with each other in an antiferromagnetic manner with the nonmagnetic layer 254. Specifically, the ferromagnetic layer 253c and the ferromagnetic layer 255 are coupled with each other to have magnetization orientations antiparallel with each other, when no influence by an external magnetic field exists. For this reason, in the example of FIG. 4, the magnetization orientation of the ferromagnetic layer 253c is directed toward the ferromagnetic layer 255. The coupling structure of the ferromagnetic layer 253c, the nonmagnetic layer 254, and the ferromagnetic layer 255 is referred to as SAF (synthetic antiferromagnetic) structure. In the following explanation, antiferromagnetic coupling between the ferromagnetic layer 253c and the ferromagnetic layer 255 is also simply referred to as "antiferromagnetic coupling".

The intensity of antiferromagnetic coupling is indicated with, for example, the absolute value |Jex2| of coupling energy Jex2 per unit area of antiferromagnetic coupling between the ferromagnetic layer 253c and the ferromagnetic layer 255. The antiferromagnetic coupling intensity |Jex2| changes in accordance with the film thickness tS2 of the nonmagnetic layer 254. The antiferromagnetic coupling intensity |Jex2| locally increases, for example, when the film thickness tS2 becomes close to a certain value. Specifically, the antiferromagnetic coupling intensity |Jex2| has a plurality of peak values corresponding to respective values of the film thickness tS2.

Each of the ferromagnetic layers 253 and 255 forms a magnetic field that may have an influence on the magnetization orientation of the surrounding ferromagnetic layer (for example, the ferromagnetic layer 251). The magnetic field is referred to as stray field. When the magnetization orientation of the ferromagnetic layer 255 is antiparallel with the magnetization orientation of the ferromagnetic layer 253, the stray field from the ferromagnetic layer 255 can reduce an influence of the stray field from the ferromagnetic layer 253 on the magnetization orientation of the ferromagnetic layer 251. In the example of FIG. 4, the stray field from the ferromagnetic layer 255 is designed, for example, to cancel the stray field from the ferromagnetic layer 253.

The nonmagnetic layer 256 is a nonmagnetic conductive film, and includes, for example, platinum (Pt), tungsten (W), tantalum (Ta), or ruthenium (Ru).

In the magnetoresistive element MTJ structured as described above, in the first embodiment, the ferromagnetic coupling intensity |Jex1| is designed to be larger than the antiferromagnetic coupling intensity |Jex2|. More specifically, by adjusting the film thickness tS1 and the film thickness tS2, it is designed such that the ferromagnetic coupling intensity |Jex1| is larger than the antiferromagnetic coupling intensity |Jex2|. In this manner, in the first embodiment, for example, the magnitude of the magnetic field necessary for disconnecting the ferromagnetic coupling is larger than the magnitude of the magnetic field necessary for disconnecting the antiferromagnetic coupling. In this case, while the ferromagnetic layer 253c and the ferromagnetic layer 255 are coupled in an antiferromagnetic manner, the ferromagnetic layer 253a and the ferromagnetic layer 253c are coupled in a ferromagnetic manner. For this reason, while the ferromagnetic layer 253c and the ferromagnetic layer 255 are coupled in an antiferromagnetic manner, the magnetization orientation of the ferromagnetic layer 253a is parallel with the magnetization orientation of the ferromagnetic layer 253c. Specifically, the ferromagnetic layer 253a, the nonmagnetic layer 253b, and the ferromagnetic layer 253c can be regarded as one ferromagnetic layer 253 having one magnetization orientation as reference layer RL, when the ferromagnetic layer 253c and the ferromagnetic layer 255 are coupled in an antiferromagnetic manner. In the following explanation according to the first embodiment, the ferromagnetic layer 253a, the nonmagnetic layer 253b, and the ferromagnetic layer 253c are explained as layers that can be regarded as one ferromagnetic layer 253 having one magnetization orientation and functioning as reference layer RL.

In the first embodiment, the ferromagnetic layer 253 is designed to have magnetization energy ΔE smaller than that of the ferromagnetic layer 251. The magnetization energy ΔE is, for example, an index indicating difficulty of magnetization reversal for the spin torque. Magnetization reversal for the spin torque becomes more difficult, as the magnetization energy ΔE increases. The magnetization energy ΔE is equivalent to thermal stability Δ, and indicated with the following expression, for example.

$$\Delta E = Ku \times \text{Vol}/(kB \times T) \approx Ms \times Hc \times A \times t/(kB \times T)$$

Ku is anisotropic energy, and "Ku=Ms×Hk" is satisfied. Ms and Hk are saturated magnetization and anisotropic magnetic field, respectively. The anisotropic magnetic field Hk can be approximated as "Hk≈Kc", when the ferromagnetic layer can be regarded as a single magnetic section structure. Hc is coercive force. Vol is volume, and "Vol=A×t". A and t are a cross section along the xy plane, and a film thickness along the z-axis direction, respectively kB and T are Bortzman constant and temperature, respectively.

To set the magnetization energy ΔE_RL of the ferromagnetic layer 253 to be smaller than the magnetization energy ΔE_SL of the ferromagnetic layer 251, for example, the product Ms_RL×tRL of the saturated magnetization Ms_RL of the ferromagnetic layer 253 and the film thickness tRL is desirably smaller than the product of Ms_SL×tSL of the saturated magnetization Ms_SL of the ferromagnetic layer 251 and the film thickness tSL. Specifically, for example, at least one of the following two is satisfied: saturated magnetization Ms_RL of the ferromagnetic layer 253 is smaller than saturated magnetization Ms_SL of the ferromagnetic layer 251; and the film thickness tRL of the ferromagnetic layer 253 is smaller than the film thickness tSL of the ferromagnetic layer 251. In addition, for example, the coercive force Hc_RL of the ferromagnetic layer 253 is desirably smaller than the coercive force Hc_SL of the ferromagnetic layer 251. In addition, for example, the volume Vol_RL of the ferromagnetic layer 253 is desirably smaller than the volume Vol_SL of the ferromagnetic layer 251.

Each of the tapered angles θSL and θIRL desirably has a value larger than 0 degree and smaller than 90 degree (0<(θSL, θIRL)<90), from the viewpoint of setting the volume Vol_SL of the ferromagnetic layer 251 to be larger than the volume Vol_RL of the ferromagnetic layer 253. However, each of the ferromagnetic layers 251 and 253a maintains perpendicular magnetization with interface magnetic anisotropy in the interface between itself and the nonmagnetic layer 252. For this reason, when the portion of the ferromagnetic layer 251 close to the interface between itself and the nonmagnetic layer 252 is tapered with the tapered angle θSL (>0), there is the possibility that the tapered portion cannot receive influence of interface magnetic anisotropy. In this case, anisotropic energy Ku of the ferromagnetic layer 251 can be smaller than the anisotropic energy Ku of the ferromagnetic layer 251 that is not tapered. For this reason, it is not desirable to taper the portion close to the nonmagnetic layer 252. In addition, generally, because the tapered portion is easily damaged by magnetism when the magnetoresistive element MTJ is provided, it is not desirable to rapidly taper the portion.

To satisfy the conditions described above, the film thickness tSL is desirably 0.5 nm to 3.0 nm. The film thickness tIRL is desirably 0.5 nm to 2.0 nm. Each of the tapered angle θSL and θIRL is desirably set within a range of, for example, 70 degree or more and less than 90 degree (70≤(θSL, θIRL)<90), and each of the film thicknesses tSL_T and tIRL_T is desirably set to 1.0 nm or less. In addition, from the viewpoint of maintaining the anisotropic energy Ku at a practicable value, more preferably, each of the tapered angles θSL and θIRL is desirably set within a range of, for example, 80 degree or more and less than 90 degree (80≤(θSL, θIRL)<90), and each of the film thicknesses tSL_T and tIRL_T is desirably set to 0.5 nm or less.

The first embodiment adopts spin injection writing method in which a write current is caused to directly flow through such magnetoresistive element MTJ, and a spin torque is injected into the storage layer SL and the reference layer RL with the write current, to control the magnetization orientation of the storage layer SL and the magnetization orientation of the reference layer RL. The magnetoresistive element MTJ can have one of a low resistance state and a high resistance state, according to whether the relative relation between the magnetization orientations of the storage layer SL and the reference layer RL is parallel or antiparallel.

When a write current Iw0 of a certain intensity is caused to flow through the magnetoresistive element MTJ in a direction of an arrow a1 in FIG. 4, that is, in a direction going from the storage layer SL to the reference layer RL, the relative relation between the magnetization orientations of the storage layer SL and the reference layer RL becomes parallel. In the case of the parallel state, the resistance value of the magnetoresistive element MTJ becomes lowest, and the magnetoresistive element MTJ is set to the low resistance state. The low resistance state is referred to as "P (parallel) state", and, for example, defined as data "0" state.

When a write current Iw1 larger than the write current Iw0 is caused to flow through the magnetoresistive element MTJ in a direction of an arrow a2 in FIG. 4, that is, in a direction (the same direction as the arrow a1) going from the storage layer SL to the reference layer RL, the relative relation between the magnetization orientations of the storage layer SL and the reference layer RL becomes antiparallel. In the case of the antiparallel state, the resistance value of the magnetoresistive element MTJ becomes highest, and the magnetoresistive element MTJ is set to the high resistance state. The high resistance state is referred to as "AP (antiparallel) state", and, for example, defined as data "1" state.

In the following explanation, explanation is made in accordance with the data defining method as described above, but the method of defining data "1" and data "0" is not limited to the example described above. For example, the P state may be defined as data "1", and the AP state may be defined as data "0".

1.1.5 Characteristic of Magnetoresistive Element

The following is explanation of characteristics of the magnetoresistive element of the magnetic storage device structured as described above according to the first embodiment.

FIG. 5 is a diagram illustrating magnetoresistive characteristics (R—H characteristics) of the magnetoresistive element of the magnetic storage device according to the first embodiment. FIG. 5 illustrates R—H characteristics of the magnetoresistive element MTJ including the storage layer SL having coercive force Hc_SL larger than the coercive force Hc_RL of the reference layer RL (Hc_SL>Hc_RL), to satisfy the condition relating to the magnetization energy ΔE between the storage layer SL and the reference layer RL described above. The R—H characteristics indicates the state in which the resistance value changes according to the magnitude of the magnetic field applied from outside. FIG. 5 also illustrates magnetization reversal behavior of the storage layer SL and the reference layer RL changing according to the magnitude of the magnetic field.

The R—H characteristics including magnetization reversal behavior of the storage layer SL and the reference layer RL is also referred to as major loop, and distinguished from the R—H characteristics (minor loop) indicating the magnetization reversal behavior of the storage layer SL alone. As described above, because the magnetization orientation of the shift cancelling layer SCL is fixed, FIG. 5 does not illustrate magnetization reversal behavior of the shift cancelling layer SCL. Accordingly, within the range of the magnetic field illustrated in FIG. 5, the magnetization orientation of the shift cancelling layer SCL is fixed in a direction in which the arrow is directed toward the reference layer RL side. With this structure, the magnitude of the magnetic field in FIG. 5 has a positive direction in a direction parallel with the fixed magnetization orientation of the shift cancelling layer SCL, for the convenience' sake.

As illustrated in FIG. 5, in an initial state (1a), the magnetization orientations of the reference layer RL and the shift cancelling layer SCL are antiparallel, and the magnetization orientations of the reference layer RL and the storage layer SL are parallel. Specifically, in the initial state (1a), the magnetoresistive element MTJ is in the low resistance state having a resistance value R0. From this state, when the magnetic field is applied in the direction going from the shift cancelling layer SCL to the storage layer SL, the magnetization orientation of the storage layer SL is reversed in the vicinity of the magnetic field H_SL1, and the magnetoresistive element MTJ is changed to the high resistance state having a resistance value R1 (1b). More specifically, for example, the resistance value of the magnetoresistive element MTJ reaches a resistance value (R1+R0)/2 serving as an intermediate value between the resistance value R0 and the resistance value R1 in the magnetic field H_SL1. Thereafter, the resistance value of the magnetoresistive element MTJ becomes larger than the magnetic field H_SL1, and thereafter promptly reaches the resistance value R1.

When the applied magnetic field is further increased, in the vicinity of the magnetic field H_RL1, the magnetization orientation of the reference layer RL is reversed, and the magnetoresistive element MTJ is changed to the low resistance state (1c). More specifically, for example, the resistance value of the magnetoresistive element MTJ reaches the resistance value (R1+R0)/2 in the magnetic field H_RL1. Thereafter, the resistance value of the magnetoresistive element MTJ becomes larger than the magnetic field H_RL1, and thereafter promptly reaches the resistance value R0. In the state (1c), the magnetization orientations of the storage layer SL, the reference layer RL, and the shift cancelling layer SCL become parallel.

From this state, when the applied magnetic field is decreased, the magnetization orientation of the reference layer RL is reversed in the vicinity of the magnetic field H_RL2, and the magnetoresistive element MTJ is changed to the high resistance state (1b). More specifically, for example, the resistance value of the magnetoresistive element MTJ reaches the resistance value (R1+R0)/2 in the magnetic field H_RL2. Thereafter, the resistance value of the magnetoresistive element MTJ becomes smaller than the magnetic field H_RL2, and thereafter promptly reaches the resistance value R1.

When the applied magnetic field is further decreased, the magnetization orientation of the storage layer SL is reversed in the vicinity of the negative magnetic field H_SL2, and the magnetoresistive element MTJ is changed to the low resistance state, and returns to the initial state (1a). More specifically, for example, the resistance value of the magnetoresistive element MTJ reaches the resistance value (R1+R0)/2 in the magnetic field. H_SL2. Thereafter, the resistance value of the magnetoresistive element MTJ becomes smaller than the magnetic field H_SL2, and thereafter promptly reaches the resistance value R0.

As described above, with the magnetoresistive element MTJ according to the first embodiment, when the reference layer RL can be regarded as having one magnetization orientation, the main reference layer MRL and the interface reference layer IRL in the reference layer RL invert the magnetization orientations for the shift cancelling layer SCL, while maintaining magnetization orientations parallel with each other in the major loop.

As described above, in the example of FIG. 5, the coercive force Hc_SL of the storage layer SL is larger than the coercive force Hc_RL of the reference layer RL. In the R—H characteristics, the intensity of the coercive force Hc_SL of the storage layer SL is indicated with, for example, a half value of the difference between the magnetic field H_SL1 and the magnetic field H_SL2 (Hc_SL=(H_SL1−H_SL2)/2). In other words, the intensity of the coercive force Hc_SL indicated with a magnitude from the intermediate value (H_SL1+H_SL2) between the magnetic field H_SL1 and the magnetic field H_SL2 to the magnetic field H_SL1 or the H_SL2. In the same manner, in the R—H characteristics, the intensity of the coercive force Hc_RL of the reference layer RL is indicated with, for example, a half value (Hc_RL=(H_RL1−H_RL2)/2) of the difference between the magnetic field H_RL1 and the magnetic field H_RL2. In other words, the intensity of the coercive force Hc_RL is indicated with a magnitude from the intermediate value (H_RL1+H_RL2) between the magnetic field H_RL1 and the magnetic field H_RL2 to the magnetic field H_RL1 or the H_RL2.

Figure 6:
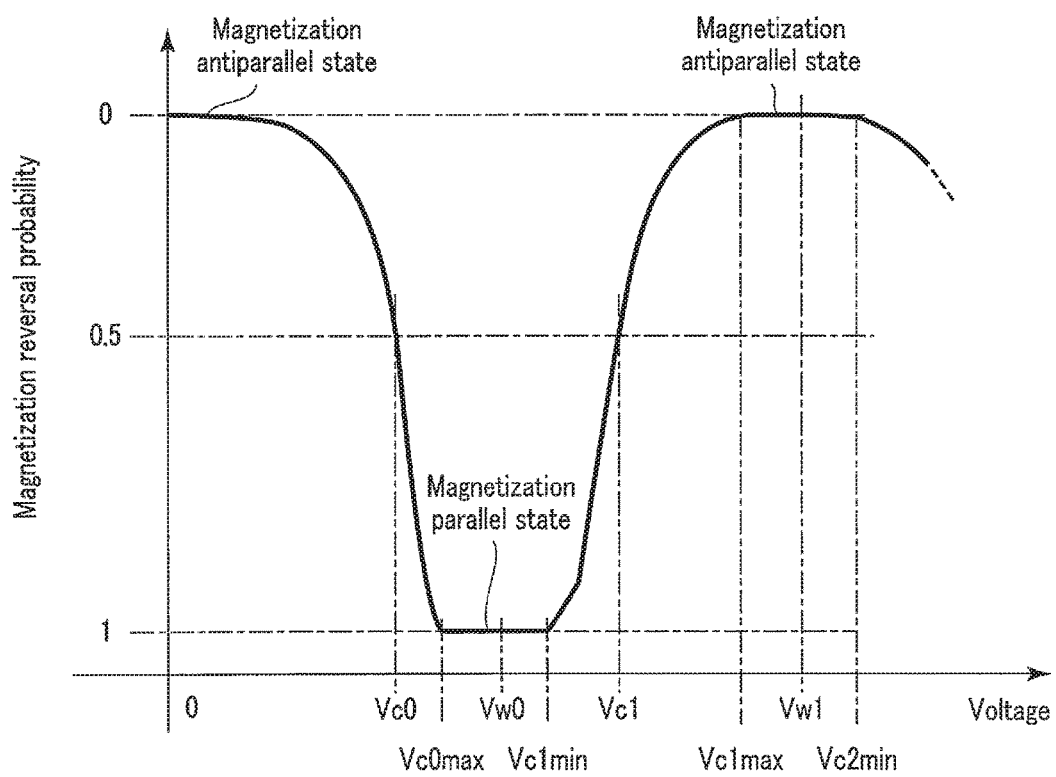
FIG. 6 is a diagram for explaining magnetization reversal characteristic of the magnetoresistive element of the magnetic storage device according to the first embodiment.

In addition, FIG. 6 is a diagram for explaining magnetization reversal characteristics of the magnetoresistive element MTJ of the magnetic storage device according to the first embodiment. FIG. 6 illustrates the voltage applied to the magnetoresistive element MTJ, and the magnetization reversal probability of the storage layer SL and the reference layer RL when the voltage is supplied. The magnetization reversal probability in FIG. 6 is defined as probability that the magnetization orientation of the storage layer SL is parallel with the magnetization orientation of the reference layer RL. Specifically, when the magnetization reversal probability is "0", the magnetization orientations of the storage layer SL and the reference layer RL are parallel with each other with the probability of 0% (specifically, the magnetization orientations are antiparallel with each other with the probability of 100%). When the magnetization reversal probability is "0.5", the magnetization orientations of the storage layer SL and the reference layer RL are parallel with each other with the probability of 50% (specifically, the magnetization orientations are antiparallel with each other with the probability of 50%). When the magnetization reversal probability is "1", the magnetization orientations of the storage layer SL and the reference layer RL are parallel with each other with the probability of 100% (specifically, the magnetization orientations are antiparallel with each other with the probability of 0%). The voltage applied in FIG. 6 is positive when the voltage on the storage layer SL side of the magnetoresistive element MTJ is higher than that on the reference layer RL. FIG. 6 illustrates that the magnetization orientation of the storage layer SL is antiparallel with the magnetization orientation of the reference layer RL (the magnetization reversal probability is "0"), in the state where no voltage is supplied.

As illustrated in FIG. 6, as the voltage applied to the magnetoresistive element MTJ is gradually increased from "0", the magnetization reversal probability increases. Specifically, the magnetization reversal probability reaches "0.5" at voltage Vc0, and reaches "1" at Vc0max larger than the voltage Vc0. Thereafter, in the range from the voltage Vc0max to the voltage Vc1min larger than the voltage Vc0max, the magnetization reversal probability is maintained at "1".

As the voltage applied to the magnetoresistive element MTJ is further gradually increased from the voltage Vc1min, the magnetization reversal probability decreases. Specifically, the magnetization reversal probability reaches "0.5" at voltage Vc1 larger than the voltage Vc1min, and reaches "0" at voltage Vc1max larger than voltage Vc1. Thereafter, in the range from the voltage Vc1max to the voltage Vc2min larger than the voltage Vc1max, the magnetization reversal probability is maintained at "0".

As the voltage applied to the magnetoresistive element MTJ is further gradually increased from the voltage Vc2min, the magnetization reversal probability increases again.

As described above, with the magnetoresistive element MTJ according to the first embodiment, voltage Vw0 with which the magnetization orientation of the storage layer SL is parallel with the magnetization orientation of the reference layer RL exists between the voltage Vc0max and the voltage Vc1min. With the magnetoresistive element MTJ according to the first embodiment, voltage Vw1 with which the magnetization orientation of the storage layer SL is antiparallel with the magnetization orientation of the reference layer RL exists between the voltage Vc1max and the voltage Vc2min.

1.2 Write Operation

The following is explanation of a write operation of the magnetic storage device according to the first embodiment. In the following explanation, the magnetization orientations of the ferromagnetic layers (storage layer SL, reference layer RL, and shift cancelling layer SCL) will be explained, in the elements in the magnetoresistive elements MTJ, and explanation of the other nonmagnetic layers will be omitted, to simplify the explanation.

1.2.1 Outline of Write Operation

Figure 7:
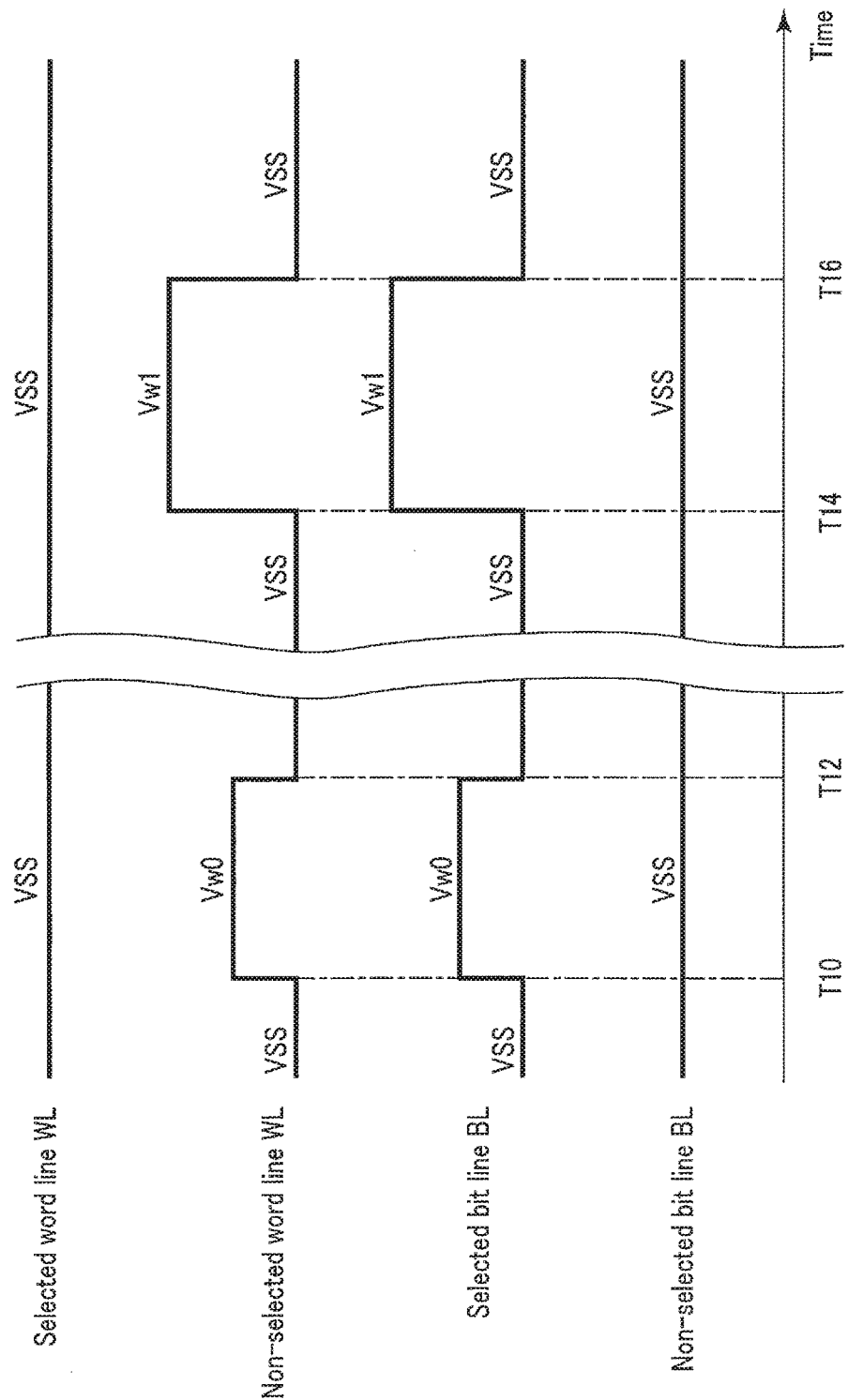
FIG. 7 is a timing chart for explaining a write operation in the magnetic storage device according to the first embodiment.

First, the following is outline of a write operation in the magnetic storage device according to the first embodiment with reference to FIG. 7. FIG. 7 is a timing chart for explaining an outline of a write operation of the magnetic storage device according to the first embodiment. FIG. 7 illustrates a state in which a voltage to write data "0" to the memory cell MC serving as the write target is supplied in a period from time T10 to time T12. FIG. 7 also illustrates a state in which a voltage to write data "1" is supplied in a period from time T14 to time T16. FIG. 7 also illustrates the voltage supplied to the bit line BL and the word line WL corresponding to the memory cell MC serving as the write target, and bit lines BL and word lines WL that do not correspond to the memory cell MC serving as the write target, in write to the memory cell MC serving as the write target.

In the following explanation, the memory cell MC serving as the write target is referred to as "selected memory cell MC", and the bit line BL and the word line WL corresponding to the selected memory cell MC are referred to as "selected bit line BL and selected word line WL". The bit lines BL and the word line WL that do not correspond to the selected memory cell MC are referred to as "non-selected bit lines BL and non-selected word lines WL".

First, the following is explanation of an operation in the case where data "0" is written.

As illustrated in FIG. 7, until time T10, the bit lines BL and the word lines WL are supplied with, for example, voltage VSS.

At time T10, each of the selected bit line BL and the selected word line WL is supplied with voltage Vw0 and voltage VSS. In this manner, because the first end of the selected memory cell MC has voltage Vw0 and the second end of the selected memory cell MC has voltage VSS, current Iw0 flows through the magnetoresistive element MTJ in the selected memory cell MC, from the selected bit line BL to the selected word line WL.

By contrast, each of the non-selected bit lines BL and the non-selected word lines WL is supplied with voltage VSS and voltage Vw0.

In this manner, no current flows through a non-selected memory cell MC having a first end connected with the selected bit line BL and a second end connected with the non-selected word line WL, because both the first end and the second end have voltage Vw0 and have the same potential. In addition, no current flows through a non-selected memory cell MC having a first end connected with the non-selected bit line BL and a second end connected with the selected word line WL, because both the first end and the second end have voltage VSS and have the same potential. In addition, in a non-selected memory cell MC having a first end connected with the non-selected bit line BL and a second end connected with the non-selected word line WL, because the first end has voltage VSS and the second end has voltage Vw0, the potential at the output end is higher than that at the input end of the selector SEL. For this reason, with the rectifying function of the selector SEL, no current flows from the non-selected word line WL to the non-selected bit line BL. Accordingly, current Iw0 flows only from the selected bit line BL to the selected word line WL.

At time T12, voltage VSS is supplied to the selected bit line BL. In addition, for example, voltage VSS is supplied to the non-selected word lines WL. In this manner, supply of current to the selected memory cell MC is stopped.

The write of data "0" to the selected memory cell MC is finished with the operation described above.

The following is explanation of an operation in the case where data "1" is written, with reference to FIG. 7.

Until time T14, for example, voltage VSS is supplied to the bit lines BL and the word lines WL.

At time T14, voltage Vw1 larger than the voltage Vw0 is supplied to the selected bit line BL, and voltage VSS is supplied to the selected word line WL. In this manner, because the first end of the selected memory cell MC has voltage Vw1 and the second end of the selected memory cell MC has voltage VSS, current Iw1 larger than current Iw0 flows through the magnetoresistive element MTJ.

By contrast, voltage VSS and voltage Vw1 are supplied to the non-selected bit lines BL and the non-selected word lines WL.

In this manner, no current flows through a non-selected memory cell MC having a first end connected with the selected bit line BL and a second end connected with the non-selected word line WL, because both the first end and the second end have voltage Vw1 and have the same potential. In addition, no current flows through a non-selected memory cell MC having a first end connected with the non-selected bit line BL and a second end connected with the selected word line WL, because both the first end and the second end have voltage VSS and have the same potential. In addition, in a non-selected memory cell MC having a first end connected with the non-selected bit line BL and a second end connected with the non-selected word line WL, because the first end has voltage VSS and the second end has voltage Vw1, the potential at the output end is higher than that at the input end of the selector SEL. For this reason, with the rectifying function of the selector SEL, no current flows from the non-selected word line WL to the non-selected bit line BL. Accordingly, current Iw1 flows only from the selected bit line BL to the selected word line WL.

At time T16, voltage VSS is supplied to the selected bit line BL. In addition, for example, voltage VSS is supplied to the non-selected word lines WL. In this manner, supply of current to the selected memory cell MC is stopped.

The write of data "1" to the selected memory cell MC is finished with the operation described above.

1.2.2 Change of Magnetization orientation in Write Operation

Figure 10:
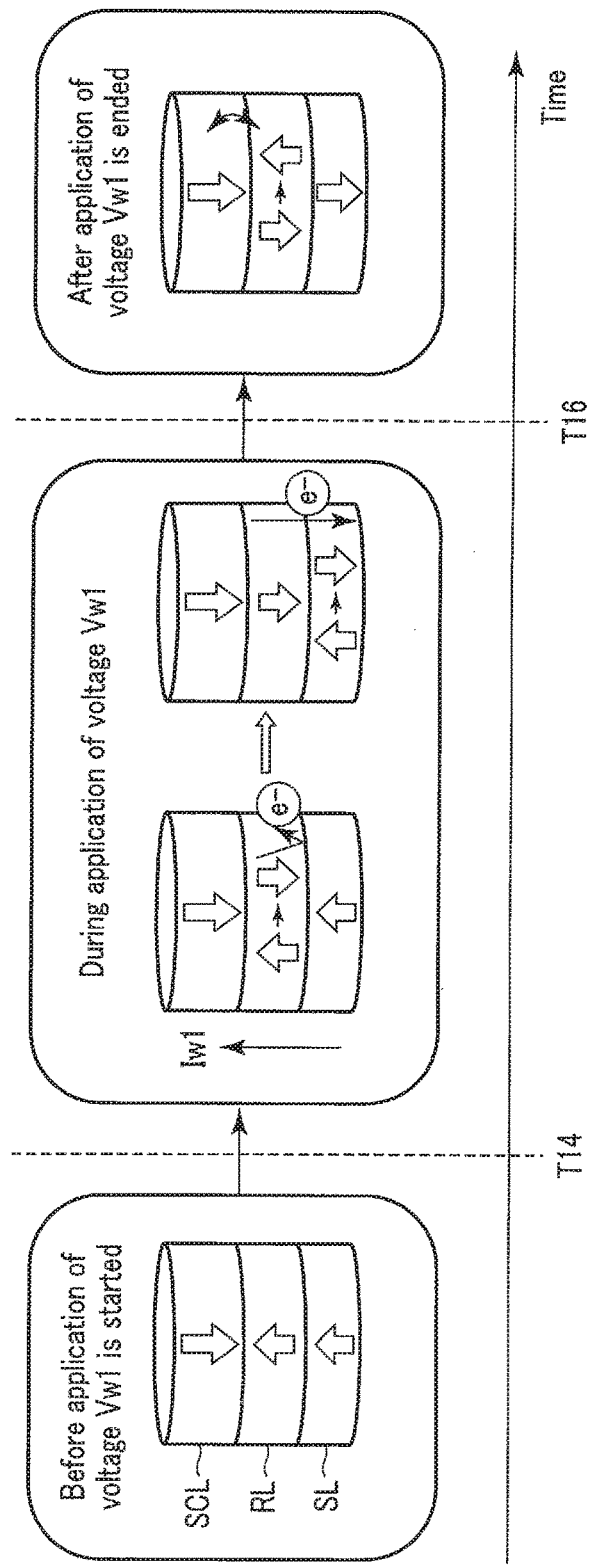
FIG. 10 is a schematic diagram for explaining an operation of writing data "1" in the magnetic storage device according to the first embodiment.

The following is explanation of change of the magnetization orientation in a write operation in the magnetic storage device according to the first embodiment n with reference to FIG. 8 to FIG. 11. FIG. 8 and FIG. 9 are schematic diagrams illustrating an example of change of the magnetization orientation of the magnetoresistive element in a write operation of data "0" in the magnetic storage device according to the first embodiment. FIG. 8 illustrates the case of writing data "0" from the state in which data "1" is written, and FIG. 9 illustrates the case of writing data "0" from the state in which data "0" is written. FIG. 10 and FIG. 11 are schematic diagrams illustrating an example of change of the magnetization orientation of the magnetoresistive element in a write operation of data "1" in the magnetic storage device according to the first embodiment. FIG. 10 illustrates the case of writing data "1" from the state in which data "0" is written, and FIG. 11 illustrates the case of writing data "1" from the state in which data "1" is written. Time T10 to T12 in FIG. 8 and FIG. 9 and time T14 to T16 in FIG. 10 and FIG. 11 correspond to time 110 to T16 in FIG. 7.

First, the following is explanation of change of magnetization orientation at the time when data "0" is written from the state in which data "1" is written.

As illustrated in FIG. 8, until time T10, the magnetization orientation of the reference layer RL is antiparallel with the magnetization orientation of the shift cancelling layer SCL. The magnetization orientation of the storage layer SL is antiparallel with the magnetization orientation of the reference layer RL. Until time T10, in writing of data "0", because the controller 16 does not select the selected memory cell MC, no current flows through the magnetoresistive element MTJ.

During a period from time T10 to time T12, the controller 16 applies voltage Vw0 to the magnetoresistive element MTJ in the selected memory cell MC, and causes current Iw0 to flow from the storage layer SL to the shift cancelling layer SCL. With the current Iw0, a spin torque having a magnetization orientation parallel with the magnetization orientation of the reference layer RL is injected into the storage layer SL. In this manner, the magnetization orientation of the storage layer SL is reversed to a direction parallel with the magnetization orientation of the reference layer RL.

At time T12, the controller 16 stops application of voltage Vw0 to the magnetoresistive element MTJ in the selected memory cell MC. In this manner, the magnetization orientation of the storage layer SL is parallel with the magnetization orientation of the reference layer RL, and data "0" is written.

The following is explanation of change of the magnetization orientation at the time data "0" is written from the state in which data "0" is written.

As illustrated in FIG. 9, until time T10, the magnetization orientation of the reference layer RL is antiparallel with the magnetization orientation of the shift cancelling layer SCL. The magnetization orientation of the storage layer SL is parallel with the magnetization orientation of the reference layer RL. Until time T10, in writing of data "0", because the controller 16 does not select the selected memory cell MC, no current flows through the magnetoresistive element MTJ.

During a period from time T10 to time T12, the controller 16 applies voltage Vw0 to the magnetoresistive element MTJ in the selected memory cell MC, and causes current Iw0 to flow from the storage layer SL to the shift cancelling layer SCL. With this operation, a spin torque parallel with the magnetization orientation of the reference layer RL is injected into the storage layer SL. However, because the magnetization orientation of the storage layer SL has already become parallel with the magnetization orientation of the reference layer RL, the magnetization orientation of the storage layer SL is not changed with the current Iw0. By contrast, with the current Iw0, a spin torque having a magnetization orientation antiparallel with the magnetization orientation of the storage layer SL is injected into the reference layer RL. However, because the spin torque injected into the reference layer RL with the current Iw0 is not large enough to reverse the magnetization orientation of the reference layer RL, the magnetization orientation of the reference layer RL is not changed.

At time T12, the controller 16 stops application of voltage Vw0 to the magnetoresistive element MTJ in the selected memory cell MC. In this manner, the magnetization orientation of the storage layer SL is parallel with the magnetization orientation of the reference layer RL, and data "0" is written.

The writing of data "0" to the selected memory cell MC is finished with the operation described above.

The following is explanation of change of magnetization orientation at the time when data "1" is written from the state in which data "0" is written.

As illustrated in FIG. 10, until time T14, the magnetization orientation of the reference layer RL is antiparallel with the magnetization orientation of the shift cancelling layer SCL. The magnetization orientation of the storage layer SL is parallel with the magnetization orientation of the reference layer RL. Until time T14, in writing of data "1", because the controller 16 does not-select the selected memory cell MC, no current flows through the magnetoresistive element MTJ.

During a period from time T14 to time T16, the controller 16 applies voltage Vw1 to the magnetoresistive element MTJ in the selected memory cell MC, and causes current Iw1 to flow from the storage layer SL to the shift cancelling layer SCL. With the current Iw1, a spin torque having a magnetization orientation antiparallel with the magnetization orientation of the storage layer SL is injected into the reference layer RL. The spin torque injected into the reference layer RL with the current Iw1 is large enough to reverse the magnetization orientation of the reference layer RL. For this reason, the magnetization orientation of the reference layer RL is reversed to a direction antiparallel with the magnetization orientation of the storage layer SL.

Thereafter, with the current Iw1, a spin torque having a magnetization orientation parallel with the magnetization orientation of the reference layer RL is injected into the storage layer SL. In this manner, the magnetization orientation of the storage layer SL is reversed to a direction parallel with the magnetization orientation of the reference layer RL.

At time T16, the controller 16 stops application of voltage Vw1 to the magnetoresistive element MTJ in the selected memory cell MC. With this operation, injection of the spin torque into the reference layer RL and the storage layer SL is stopped. The magnetization orientation of the reference layer RL is reversed to a direction antiparallel with the magnetization orientation of the shift cancelling layer SCL, by antiferromagnetic coupling with the shift cancelling layer SCL. In this manner, the magnetization orientation of the storage layer SL becomes antiparallel with the magnetization orientation of the reference layer RL, and data "1" is written.

The following is explanation of change of magnetization orientation at the time when data "1" is written from the state in which data "1" is written.

As illustrated in FIG. 11, until time T14, the magnetization orientation of the reference layer RL is antiparallel with the magnetization orientation of the shift cancelling layer SCL. The magnetization orientation of the storage layer SL is antiparallel with the magnetization orientation of the reference layer RL. Until time T14, in writing of data "1", because the controller 16 does not select the selected memory cell MC, no current flows through the magnetoresistive element MTJ.

During a period from time T14 to time T16, the controller 16 applies voltage Vw1 to the magnetoresistive element MTJ in the selected memory cell MC, and causes current Iw1 to flow from the storage layer SL to the shift cancelling layer SCL. With the current Iw1, a spin torque having a magnetization orientation parallel with the magnetization orientation of the reference layer RL is injected into the storage layer SL. In this manner, the magnetization orientation of the storage layer SL is reversed to a direction parallel with the magnetization orientation of the reference layer RL.

Thereafter, with the current Iw1, a spin torque having a magnetization orientation antiparallel with the magnetization orientation of the storage layer SL is injected into the reference layer RL. The spin torque injected into the reference layer RL with the current Iw1 is large enough to reverse the magnetization orientation of the reference layer RL. For this reason, the magnetization orientation of the reference layer RL is reversed to a direction antiparallel with the magnetization orientation of the storage layer SL.

Thereafter, with the current Iw1, a spin torque having a magnetization orientation parallel with the magnetization orientation of the reference layer RL is injected into the storage layer SL. In this manner, the magnetization orientation of the storage layer SL is reversed to a direction antiparallel with the magnetization orientation of the reference layer RL.

At time T16, the controller 16 stops application of voltage Vw1 to the magnetoresistive element MTJ in the selected memory cell MC. With this operation, injection of the spin torque into the reference layer RL and the storage layer SL is stopped. The magnetization orientation of the reference layer RL is reversed to a direction antiparallel with the magnetization orientation of the shift cancelling layer SCL, with antiferromagnetic coupling with the shift cancelling layer SCL. In this manner, the magnetization orientation of the storage layer SL becomes antiparallel with the magnetization orientation of the reference layer RL, and data "1" is written.

The writing of data "1" to the selected memory cell MC is finished with the operation described above.

1.3 Effect of the Present Embodiment

The first embodiment enables write of two pieces of different data with a write current of one direction. The effect will be explained hereinafter.

Generally, when a current flows from the storage layer to the reference layer, a spin torque antiparallel with the magnetization orientation of the storage layer is injected into the reference layer. Specifically, when the magnetization of the storage layer is parallel with the magnetization orientation of the reference layer, with a current flowing from the storage layer to the reference layer, a spin torque in a direction reversing the magnetization orientation is injected into the reference layer. By contrast, the magnetization orientation of the reference layer is more firmly fixed, and more hardly reversed with an external magnetic field or a spin torque, as the magnetization energy increases.

According to the first embodiment, the magnetization energy $\Delta E\_RL$ of the reference layer RL is smaller than the magnetization energy $\Delta E\_SL$ of the storage layer SL. To satisfy the relation described above, for example, the coercive force Hc_RL of the reference layer RL is smaller than the coercive force Hc_SL of the storage layer SL. In addition, for example, the product Ms_RL×tRL of the saturated magnetization Ms_RL and the film thickness tRL of the reference layer RL are smaller than the product Ms_SL×tSL of the saturated magnetization Ms_SL and the film thickness tSL of the storage layer SL. For example, the voltage Vol_RL of the reference layer RL is smaller than the volume Vol_SL of the storage layer SL. In this manner, the magnetization orientation of the reference layer RL having a magnetization orientation parallel with the magnetization orientation of the storage layer SL is reversed with a spin torque injected from the storage layer SL, when a current flows from the storage layer SL to the reference layer RL.

The controller 16 applies voltage Vw0 to the memory cell MC such that current Iw0 from the storage layer SL to the reference layer RL, in writing of data "0". The current Iw0 is set to intensity to cause the magnetization orientation of the reference layer RL to be parallel with the magnetization orientation of the storage layer SL (the magnetization reversal probability is "1"), when the magnetization energy $\Delta E\_RL$ of the reference layer RL is smaller than the magnetization energy $\Delta E\_SL$ of the storage layer SL. In this manner, the magnetization orientation of the reference layer RL is not reversed with a spin torque injected into the reference layer RL with the current Iw0. For this reason, data "0" can be written to the magnetoresistive element MTJ.

The controller 16 applies voltage Vw1 to the memory cell MC such that current Iw1 larger than the current Iw0 flows from the storage layer SL to the reference layer RL, in write of data "1". The current Iw1 is set to intensity to cause the magnetization orientation of the reference layer RL to be antiparallel with the magnetization orientation of the storage layer SL (the magnetization reversal probability is "0"), when the magnetization energy ΔE_RL of the reference layer RL is smaller than the magnetization energy ΔE_SL of the storage layer SL. In this manner, the reference layer RL is subjected to magnetization reversal with a spin torque injected with the current Iw1. For this reason, data "1" can be written to the magnetoresistive element MTJ.

The ferromagnetic coupling between the main reference layer MRL and the interface reference layer IRL is stronger than the antiferromagnetic coupling between the main reference layer MRL and the shift cancelling layer SCL. In this manner, the ferromagnetic coupling is harder to be disconnected than the antiferromagnetic coupling, for influence of the external magnetic field or spin torque. For this reason, the main reference layer MRL and the interface reference layer IRL can be regarded as having parallel magnetization orientations, when the main reference layer MRL and the shift cancelling layer SCL are coupled in an antiferromagnetic manner.

In addition, as the integration degree of the memory cells MC in the memory cell array 11 increases, the cross-sectional area of the cross section of the magnetoresistive element MTJ along the xy plane can change with a larger ratio, for example. For this reason, in the magnetoresistive element MTJ, the reference layer RL can be provided above the storage layer SL. In this manner, the cross-sectional area of the storage layer SL is enabled to be larger than the cross-sectional area of the reference layer RL, in the case where the cross-sectional areas of the upper layers in the layered structure included in the magnetoresistive element MTJ is smaller than the cross-sectional areas of the lower layers. This structure enables easy design setting the volume Vol_SL of the storage layer SL to be larger than the volume Vol_RL of the reference layer RL.

In addition, the selector SEL has a rectifying function of transmitting a current of one direction, and shutting off a current of the other direction. This structure shuts off a current flowing in a direction opposite to the write current through the magnetoresistive element MTJ.

The selector SEL includes any one of an oxide-PN junction element, a metal-oxide Schottky diode element, a MIM (metal-insulator-metal) diode element, a MSM (metal-semiconductor-metal) diode element, and an OTS (ovonic threshold switch) element. This structure enables the selector SEL to be provided such that the current path extends along the z-axis direction. This structure enables provision of the memory cells MC, without using a selector with the current path extending along the xy plane as in a planar transistor. This structure enables provision of the memory cell array 11 in a 4F2 size denser than a 6F2 size.

2. Second Embodiment

The following is explanation of a magnetic storage device according to a second embodiment. The second embodiment is different from the first embodiment, in that the ferromagnetic layer 253a, the nonmagnetic layer 253b, and the ferromagnetic layer 253c cannot be regarded as one ferromagnetic layer 253. The following explanation illustrates only points different from the first embodiment.

2.1 Structure of Magnetoresistive Element

The following is explanation of a structure of a magnetoresistive element of the magnetic storage device according to the second embodiment. Because the layered structure of the device layer 25 functioning as the magnetoresistive element MTJ according to the second embodiment is the same as the first embodiment, and explanation thereof is omitted.

The second embodiment is designed such that coupling force of ferromagnetic coupling between the ferromagnetic layer 253a and the ferromagnetic layer 253c is smaller than coupling force of antiferromagnetic coupling between the ferromagnetic layer 253c and the ferromagnetic layer 255. More specifically, the second embodiment is designed such that the absolute value |Jex1| is smaller than the absolute value |Jex2|, by adjusting the film thickness tS1 of the nonmagnetic layer 253b and the film thickness tS2 of the nonmagnetic layer 254 (|Jex1|<|Jex2|). In this manner, in the second embodiment, for example, the magnitude of the magnetic field necessary for disconnecting ferromagnetic coupling between the ferromagnetic layer 253a and the ferromagnetic layer 253c is smaller than the magnitude of the magnetic field necessary for disconnecting antiferromagnetic coupling between the ferromagnetic layer 253c and the ferromagnetic layer 255. In this case, while the ferromagnetic layer 253c and the ferromagnetic layer 255 are coupled in an antiferromagnetic manner, the magnetization orientation of the ferromagnetic layer 253a may become antiparallel with the magnetization orientation of the ferromagnetic layer 253c. Specifically, the ferromagnetic layer 253a, the nonmagnetic layer 253b, and the ferromagnetic layer 253c cannot be regarded as one ferromagnetic layer 253 functioning as reference layer RL. The following explanation according to the second embodiment is made based on the premise that the ferromagnetic layer 253a and the ferromagnetic layer 253c can have magnetization orientations different from each other.

In the second embodiment, the ferromagnetic layer 253a is designed to have magnetization energy ΔE smaller than that of the ferromagnetic layer 251.

To set the magnetization energy ΔE_IRL of the ferromagnetic layer 253a smaller than the magnetization energy ΔE_SL of the ferromagnetic layer 251, for example, the film thickness tIRL of the ferromagnetic layer 253a is desirably smaller than the film thickness tSL of the ferromagnetic layer 251. In addition, for example, the coercive force Hc_IRL of the ferromagnetic layer 253a is desirably smaller than the coercive force Hc_SL of the ferromagnetic layer 251. Besides, for example, the volume Vol_IRL of the ferromagnetic layer 253a is desirably smaller than the volume Vol_SL of the ferromagnetic layer 251.

2.2 Magnetoresistive Characteristics of Magnetoresistive Element

The following is explanation of magnetoresistive characteristics of the magnetoresistive element of the magnetic storage device according to the second embodiment.

Figure 12:
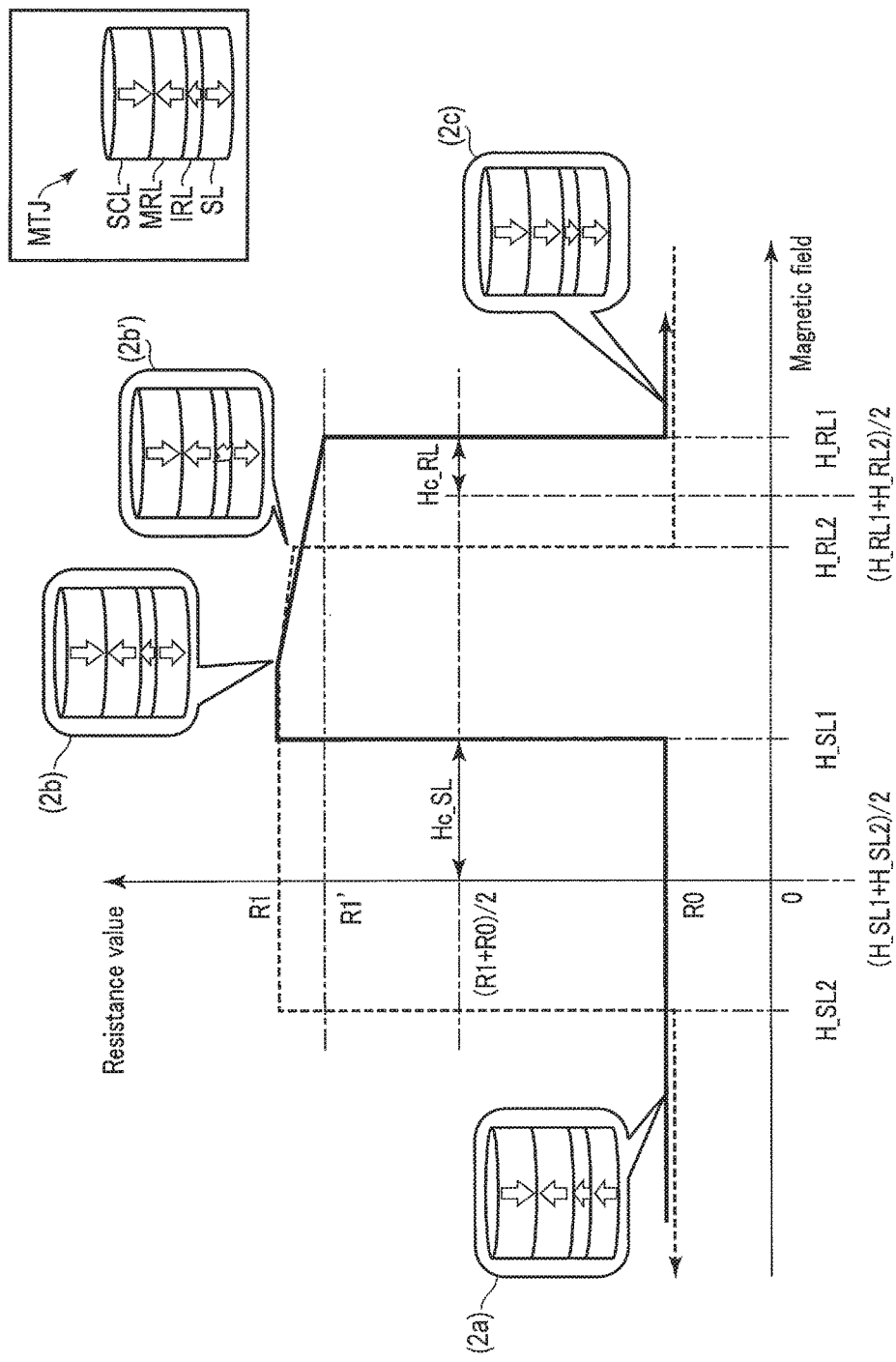
FIG. 12 is a diagram for explaining magnetoresistive characteristic of a magnetoresistive element of a magnetic storage device according to a second embodiment.

FIG. 12 is a diagram illustrating magnetoresistive characteristics (R—H characteristics) of the magnetoresistive element of the magnetic storage device according to the second embodiment. The R—H characteristics of FIG. 12 indicates magnetization reversal behavior of the storage layer SL and the reference layer RL (main reference layer MRL and interface reference layer IRL) according to the magnitude of the magnetic field applied from the outside, in the same manner as the R—H characteristics of FIG. 5. The magnitude of the magnetic field in FIG. 12 has a positive direction in a direction parallel with the magnetization orientation of the shift cancelling layer SCL, for the convenience' sake. As described above, because the magnetization orientation of the shift cancelling layer SCL is fixed, FIG. 12 does not illustrate magnetization reversal behavior of the shift cancelling layer SCL. Accordingly, within the range of the magnetic field illustrated in FIG. 12, the magnetization orientation of the shift cancelling layer SCL is fixed in a direction in which the arrow is directed toward the reference layer RL side.

As illustrated in FIG. 12, in an initial state (2a), the magnetization orientations of the reference layer RL and the shift cancelling layer SCL are antiparallel, and the magnetization orientations of the reference layer RL and the storage layer SL are parallel. Specifically, in the initial state (2a), the magnetoresistive element MTJ is in the low resistance state having a resistance value R0. From this state, when the magnetic field is applied in the direction going from the shift cancelling layer SCL to the storage layer SL, the magnetization orientation of the storage layer SL is reversed in the vicinity of the magnetic field H_SL1, and the magnetoresistive element MTJ is changed to the high resistance state having a resistance value R1 (2b). More specifically, for example, the resistance value of the magnetoresistive element MTJ reaches a resistance value (R1+R0)/2 in the magnetic field H_SL1. Thereafter, the resistance value of the magnetoresistive element MTJ becomes larger than the magnetic field H_SL1, and thereafter promptly reaches the resistance value R1.

When the applied magnetic field is further increased, the magnetization orientation of the interface reference layer IRL is gradually reversed to be antiparallel with the magnetization orientation of the main reference layer MRL. With this change, the resistance value of the magnetoresistive element MTJ gradually decreases from the resistance value R1 (2b'). The magnetization orientation of the main reference layer is not changed, while the magnetization orientation of the interface reference layer IRL is gradually reversed. When the resistance value decreases to R1' smaller than R1, the magnetization orientations of the main reference layer MRL and the interface reference layer IRL start being rapidly reversed to a direction parallel with the magnetization orientation of the storage layer SL, and the magnetoresistive element MTJ is changed to the low resistance state (2c). More specifically, for example, the resistance value of the magnetoresistive element MTJ reaches the resistance value (R1+R0)/2 in the magnetic field H_RL1. Thereafter, the resistance value of the magnetoresistive element MTJ becomes larger than the magnetic field H_RL1, and thereafter promptly reaches the resistance value R0. In the state (2c), the magnetization orientations of the storage layer SL, the reference layer RL, and the shift cancelling layer SCL become parallel.

From this state (2c), when the applied magnetic field is decreased, the magnetization orientations of the main reference layer MRL and the interface reference layer IRL are simultaneously reversed in the vicinity of the magnetic field H_RL2, and the magnetoresistive element MTJ is changed to the high resistance state. More specifically, for example, the resistance value of the magnetoresistive element MTJ reaches the resistance value (R1+R0)/2 in the magnetic field H_RL2. The magnetization orientation of the interface reference layer IRL is not entirely reversed in the magnetic field H_RL2 (2b'). Thereafter, when the applied magnetic field is decreased to the magnetic field H_SL1 and there around, the resistance value gradually increases, and reaches the resistance value R1 (2b).

When the applied magnetic field is further decreased, the magnetization orientation of the storage layer SL is reversed in the vicinity of the negative magnetic field H_SL2, and the magnetoresistive element MTJ is changed to the low resistance state. More specifically, for example, the resistance value of the magnetoresistive element MTJ reaches the resistance value (R1-R0)/2 in the magnetic field H_SL2. Thereafter, the resistance value of the magnetoresistive element MTJ becomes smaller than the magnetic field H_SL2, thereafter promptly reaches the resistance value R0, and returns to the initial state (2a).

As described above, when the reference layer RL cannot be regarded as one ferromagnetic layer 253 functioning as reference layer RL, the magnetization orientations of the main reference layer MRL and the interface reference layer IRL include a state in which the magnetization orientations are not parallel with each other in the major loop (2b'). The form of the state (2b') in FIG. 12 changes according to the intensity of ferromagnetic coupling between the interface reference layer IRL and the main reference layer MRL. The form of the state (2b') is defined with, for example, the deterioration ratio S of ferromagnetic coupling indicated with the following expression.

$$S=(R1'-R0)/(R1-R0)$$

As the value of the deterioration ratio S is smaller, the ferromagnetic coupling is weaker in comparison with the antiferromagnetic coupling between the interface reference layer IRL and the shift cancelling layer SCL. For example, the value of the deterioration ratio S is desirably 0.8 or more and less than 1.0 ($0.8 \leq S < 1.0$), more desirably 0.8 or more to 0.95 ($0.8 \leq S \leq 0.95$), further desirably 0.8 to 0.9 ($0.8 \leq S \leq 0.95$).

2.3 Change of Magnetization orientation in Write Operation

The following is explanation of change of magnetization orientation in a write operation in the magnetic storage device according to the second embodiment, with reference to FIG. 13 and FIG. 14. FIG. 13 and FIG. 14 are schematic diagrams illustrating an example of a state of change of the magnetization orientation of the magnetoresistive element in an operation of writing data "1" in the magnetic storage device according to the second embodiment. FIG. 13 illustrates the case of writing data "1" from the state in which data "0" is written, and FIG. 14 illustrates the case of writing data "1" from the state in which data "1" is written. Time T14 to time T16 in FIG. 13 and FIG. 14 correspond to the time T14 to the time T16 FIG. 7.

First, the following is explanation of change of the magnetization orientation in writing data "1" from the state in which data "0" is written.

As illustrated in FIG. 13, until time T14, the magnetization orientation of the main reference layer MRL is antiparallel with the magnetization orientation of the shift cancelling layer SCL, and parallel with the magnetization orientation of the interface reference layer IRL. The magnetization orientation of the storage layer SL is, for example, parallel with the magnetization orientations of the main reference layer MRL and the interface reference layer IRL. Until time T14, in writing of data "1", the controller 16 does not select the selected memory cell MC.

During a period from time T14 to time T16, the controller 16 applies voltage Vw1 to the magnetoresistive element MTJ in the selected memory cell MC, and causes current Iw1 to flow from the storage layer SL to the shift cancelling layer SCL. With the current Iw1, a spin torque having a magnetization orientation antiparallel with the magnetization orientation of the storage layer SL is injected into the interface reference layer IRL. The spin torque injected into the interface reference layer IRL with the current Iw1 is large enough to reverse the magnetization orientation of the interface reference layer IRL. For this reason, the magnetization orientation of the interface reference layer IRL is reversed to a direction antiparallel with the magnetization orientation of the storage layer SL.

Thereafter, with the current Iw1, a spin torque having a magnetization orientation parallel with the magnetization orientation of the interface reference layer IRL is injected into the storage layer SL. In this manner, the magnetization orientation of the storage layer SL is reversed to a direction parallel with the magnetization orientation of the interface reference layer IRL.

At time T16, the controller 16 stops application of voltage Vw1 to the magnetoresistive element MTJ in the selected memory cell MC. With this operation, injection of the spin torque into the interface reference layer IRL and the storage layer SL is stopped. The magnetization orientation of the interface reference layer IRL is reversed to a direction parallel with the magnetization orientation of the main reference layer MRL, by ferromagnetic coupling with the main reference layer MRL. In this manner, the magnetization orientation of the storage layer SL becomes antiparallel with the magnetization orientations of the interface reference layer IRL and the main reference layer MRL, and data "1" is written.

The following is explanation of change of magnetization orientation at the time when data "1" is written from the state in which data "1" is written.

As illustrated in FIG. 14, until time T14, the magnetization orientation of the main reference layer MRL is antiparallel with the magnetization orientation of the shift cancelling layer SCL, and parallel with the magnetization orientation of the interface reference layer IRL. The magnetization orientation of the storage layer SL is, for example, antiparallel with the magnetization orientations of the main reference layer MRL and the interface reference layer IRL. Until time T14, in writing of data "1", the controller 16 does not select the selected memory cell MC.

During a period from time T14 to time T16, the controller 16 applies voltage Vw1 to the magnetoresistive element MTJ in the selected memory cell MC, and causes current Iw1 to flow from the storage layer SL to the shift cancelling layer SCL. With the current Iw1, a spin torque having a magnetization orientation parallel with the magnetization orientation of the interface reference layer IRL is injected into the storage layer SL. In this manner, the magnetization orientation of the storage layer SL is reversed to a direction parallel with the magnetization orientation of the interface reference layer IRL.

Thereafter, with the current Iw1, a spin torque having a magnetization orientation antiparallel with the magnetization orientation of the storage layer SL is injected into the interface reference layer IRL. The spin torque injected into the interface reference layer IRL with the current Iw1 is large enough to reverse the magnetization orientation of the interface reference layer IRL. For this reason, the magnetization orientation of the interface reference layer IRL is reversed to a direction antiparallel with the magnetization orientation of the storage layer SL.

Thereafter, with the current Iw1, a spin torque having a magnetization orientation parallel with the magnetization orientation of the interface reference layer IRL is injected into the storage layer SL. In this manner, the magnetization orientation of the storage layer SL is reversed to a direction parallel with the magnetization orientation of the interface reference layer IRL.

At time T16, the controller 16 stops application of voltage Vw1 to the magnetoresistive element MTJ in the selected memory cell MC. With this operation, injection of the spin torque into the interface reference layer IRL and the storage layer SL is stopped. The magnetization orientation of the interface reference layer IRL is reversed to a direction parallel with the magnetization orientation of the main reference layer MRL, with ferromagnetic coupling with the main reference layer MRL. In this manner, the magnetization orientation of the storage layer SL becomes antiparallel with the magnetization orientations of the interface reference layer IRL and the main reference layer MRL, and data "1" is written.

The writing of data "1" to the selected memory cell MC is finished with the operation described above.

2.4 Effect of Present Embodiment

According to the second embodiment, the ferromagnetic coupling between the main reference layer MRL and the interface reference layer IRL is weaker than the antiferromagnetic coupling between the main reference layer MRL and the shift cancelling layer SCL. In this manner, the ferromagnetic coupling is more easily disconnected than the antiferromagnetic coupling, by influence of the external magnetic field or spin torque. For this reason, the main reference layer MRL and the interface reference layer IRL are enabled to have magnetization orientations that are not parallel, even while the main reference layer MRL and the shift cancelling layer SCL are coupled in an antiferromagnetic manner.

In addition, the magnetization energy $\Delta E\_IRL$ of the interface reference layer IRL is smaller than the magnetization energy $\Delta E\_SL$ of the storage layer SL. More specifically, the coercive force Hc_IRL of the interface reference layer IRL is smaller than the coercive force Hc_SL of the storage layer SL, and/or the product Ms_IRL×tIRL of the saturated magnetization Ms_IRL and the film thickness tIRL of the interface reference layer IRL is smaller than the product Ms_SL×tSL of the saturated magnetization Ms_SL and the film thickness tSL of the storage layer SL, and/or the voltage Vol_IRL of the interface reference layer IRL is smaller than the volume Vol_SL of the storage layer SL. In this manner, the magnetization orientation of the interface reference layer IRL having a magnetization orientation parallel with the magnetization orientation of the storage layer SL is easily reversed with a spin torque injected from the storage layer SL, when a current flows from the storage layer SL to the interface reference layer IRL.

The controller 16 applies voltage Vw0 to the memory cell MC such that current Iw0 from the storage layer SL to the interface reference layer IRL, in writing of data "0". The current Iw0 is set to an intensity to cause the magnetization orientation of the interface reference layer IRL to be parallel with the magnetization orientation of the storage layer SL (the magnetization reversal probability is "1"), when the magnetization energy $\Delta E\_IRL$ of the interface reference layer IRL is smaller than the magnetization energy $\Delta E\_SL$ of the storage layer SL. In this manner, the magnetization orientation of the interface reference layer IRL is not reversed with a spin torque injected into the interface reference layer IRL with the current Iw0. For this reason, data "0" can be written to the magnetoresistive element MTJ.

The controller 16 applies voltage Vw1 to the memory cell MC such that current Iw1 larger than the current Iw0 flows from the storage layer SL to the interface reference layer IRL, in write of data "1". The current Iw1 is set to an intensity to cause the magnetization orientation of the interface reference layer IRL to be antiparallel with the magnetization orientation of the storage layer SL (the magnetization reversal probability is "0"), when the magnetization energy ΔE_IRL of the interface reference layer IRL is smaller than the magnetization energy ΔE_SL of the storage layer SL. In this manner, the interface reference layer IRL is subjected to magnetization reversal with a spin torque injected with the current Iw1. For this reason, data "1" can be written to the magnetoresistive element MTJ.

3.1 Modifications

The structure is not limited to the forms described in the first embodiment and the second embodiment described above, but various modification are possible.

3.1 First Modification

The first embodiment and the second embodiment illustrate the case where the voltage Vw1 is larger than the voltage Vw0, but the structure is not limited thereto.

Figure 15:
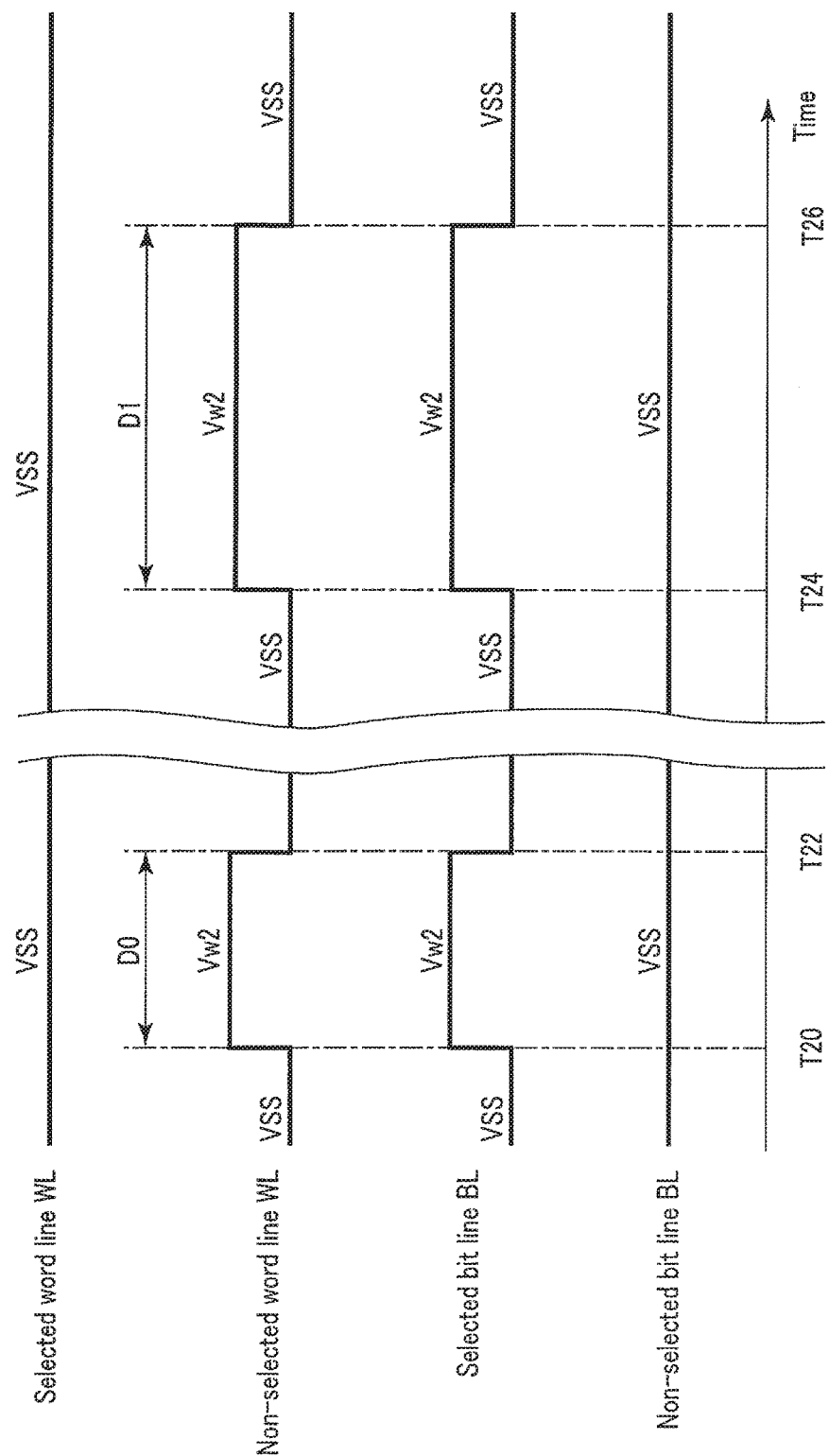
FIG. 15 is a timing chart for explaining a write operation in the magnetic storage device according to a modification.

FIG. 15 is a timing chart for explaining an outline of a write operation of a magnetic storage device according to a first modification. FIG. 15 illustrates the state in which data "0" is written to the memory cell MC serving as write target during a period from time T20 to time T22, and data "1" is written during a period from time T24 to time T26.

First, the following is explanation of an operation at the time when data "0" is written.

As illustrated in FIG. 15, until time T20, the bit lines BL and the word lines WL are supplied with, for example, voltage VSS.

At time T20, each of the selected bit line BL and the selected word line WL is supplied with voltage Vw2 and voltage VSS. In this manner, because the first end of the selected memory cell MC has voltage Vw2 and the second end of the selected memory cell MC has voltage VSS, a certain current flows through the magnetoresistive element MTJ in the selected memory cell MC, from the selected bit line BL to the selected word line WL.

By contrast, each of the non-selected bit lines BL and the non-selected word lines WL is supplied with voltage VSS and voltage Vw2.

In this manner, no current flows through a non-selected memory cell MC having a first end connected with the selected bit line BL and a second end connected with the non-selected word line WL, because both the first end and the second end have voltage Vw2 and have the same potential. In addition, no current flows through a non-selected memory cell MC having a first end connected with the non-selected bit line BL and a second end connected with the selected word line WL, because both the first end and the second end have voltage VSS and have the same potential. In addition, in a non-selected memory cell MC having a first end connected with the non-selected bit line BL and a second end connected with the non-selected word line WL, because the first end has voltage VSS and the second end has voltage Vw2, the potential at the output end is higher than that at the input end of the selector SEL. For this reason, with the rectifying function of the selector SEL, no current flows from the non-selected word line WL to the non-selected bit line BL.

At time T22, voltage VSS is supplied to the selected bit line BL. In addition, for example, voltage VSS is supplied to the non-selected word lines WL. In this manner, supply of current to the selected memory cell MC is stopped. For this reason, a certain current flows only through the selected memory cell MC, in the period D0 from the time T20 to the time T22.

The write of data "0" to the selected memory cell MC is finished with the operation described above.

The following is explanation of an operation in the case where data "1" is written, with reference to FIG. 15.

Until time T24, for example, voltage VSS is supplied to the bit lines BL and the word lines WL.

At time T24, voltage Vw2 is supplied to the selected bit line BL, and voltage VSS is supplied to the selected word line WL. In this manner, because the first end of the selected memory cell MC has voltage Vw2 and the second end of the selected memory cell MC has voltage VSS, a current flows through the magnetoresistive element MTJ.

By contrast, voltage VSS and voltage Vw1 are supplied to the non-selected bit lines BL and the non-selected word lines WL. In this manner, a certain current flows through the selected memory cell, and no current flows through a non-selected memory cell MC.

At time T26, voltage VSS is supplied to the selected bit line BL. In addition, for example, voltage VSS is supplied to the non-selected word lines WL. In this manner, supply of current to the selected memory cell MC is stopped. For this reason, a certain current flows only through the selected memory cell MC, in the period D1 from the time T24 to the time T26.

The write of data "1" to the selected memory cell MC is finished with the operation described above.

The period D1 is set longer than the period D0. This structure enables increase of the spin torque injected into the reference layer RL or the interface reference layer IRL, without increasing the magnitude of the voltage applied in write of data "1" in comparison with the voltage applied in write of data "0". This structure enables the reference layer RL or the interface reference layer IRL to be more easily subjected to magnetization reversal in the period D1 than in the period D0. Accordingly, the write operation according to the modification can obtain substantially the same effect as that of the write operations according to the first embodiment and the second embodiment.

3.2 Second Modification

The magnetoresistive element MTJ described in each of the embodiments and the modification described above is explained as element of a bottom-free type in which the reference layer RL is provided above the storage layer SL, but the magnetoresistive element MTJ may be an element of a top-free type in which the storage layer SL is provided above the reference layer RL.

Figure 16:
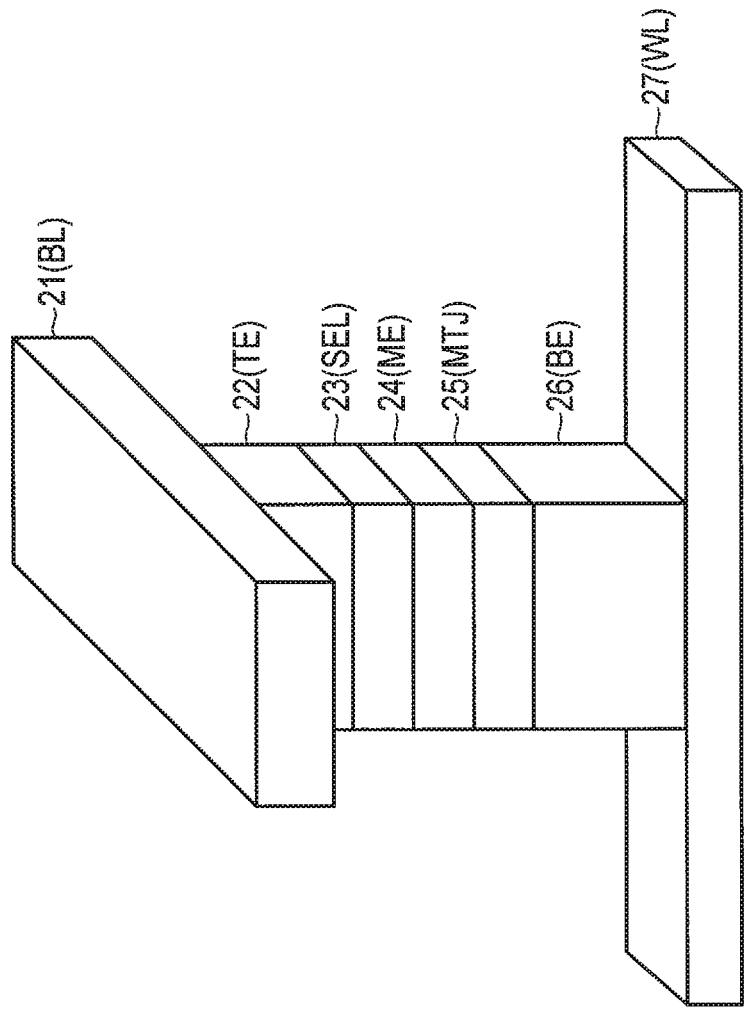
FIG. 16 is a perspective view for explaining a structure of a memory cell of the magnetic storage device according to the modification.
Figure 17:
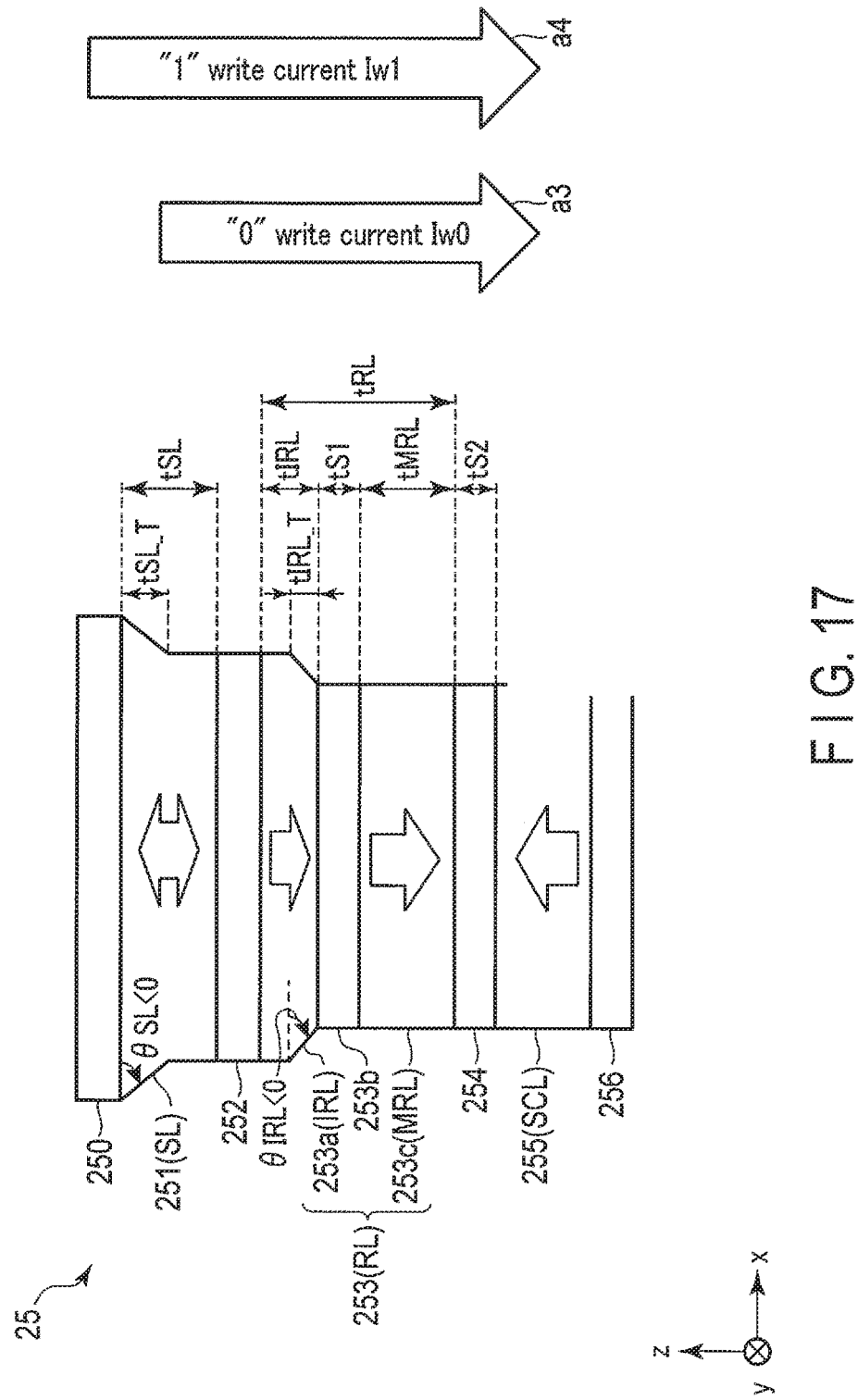
FIG. 17 is a cross-sectional view for explaining a structure of a magnetoresistive element of the magnetic storage device according to the embodiment.

FIG. 16 and FIG. 17 illustrate a configuration example in the case where the top-free type is applied. FIG. 16 is a perspective view for explaining a structure of a memory cell according to the second modification. FIG. 17 is a cross-sectional view for explaining a structure of a magnetoresistive element according to the second modification.

As illustrated in FIG. 16, a wiring layer 27, a conductive layer 26, an element layer 25, a conductive layer 24, an element layer 23, a conductive layer 22, and a wiring layer 21 are successively layered in this order on a semiconductor substrate that is not illustrated.

As illustrated in FIG. 17, the element layer 25 has a structure in which a plurality of films are layered in the z-axis direction, in the order of a nonmagnetic layer 256 (cap layer), a ferromagnetic layer 255 (shift cancelling layer SCL), a nonmagnetic layer 254 (second spacer layer), a ferromagnetic layer 253 (reference layer RL), a nonmagnetic layer 252 (tunnel barrier layer), a ferromagnetic layer 251 (storage layer SL), and a nonmagnetic layer 250 (under layer), from the word line WL side. In the ferromagnetic layer 253, a plurality of films are layered in the z-axis direction, in the order of a ferromagnetic layer 253c (main reference layer MRL), a nonmagnetic layer 253b (first spacer layer), and a ferromagnetic layer 253a (interface reference layer IRL).

When a write current Iw0 of a certain magnitude is caused to flow through the magnetoresistive element MTJ, in a direction of an arrow a3 in FIG. 17, that is, a direction going from the storage layer SL toward the reference layer RL, the relative relation of the magnetization orientations of the storage layer SL and the reference layer RL becomes parallel. In addition, when a write current Iw1 larger than the write current Iw0 is caused to flow through the magnetoresistive element MTJ, in a direction of an arrow a4 in FIG. 17, that is, a direction (the same direction as the arrow a3) going from the storage layer SL toward the reference layer RL, the relative relation of the magnetization orientations of the storage layer SL and the reference layer RL becomes antiparallel.

Each of the ferromagnetic layers 251 and 253a has, for example, an area of the upper surface larger than the area of the lower surface. More specifically, each of the ferromagnetic layers 251 and 253a has a cross-sectional area of a cross section along the xy plane including a portion gradually increasing along the +z-axis direction. Specifically, the cross section of each of the ferromagnetic layers 251 and 253a perpendicular to the xy plane includes, for example, a portion having a trapezoidal shape in which the length of the upper base is longer than the length of the lower base. Specifically, the ferromagnetic layers 251 and 253a include respective portions tapered with respective taper angles θSL and θIRL (θSL<0, θIRL<0). Each of the tapered angles θSL and θIRL is, for example, desirably set within a range being larger than −90 degree and equal to or leas than −70 degree (−70≥(θSL, θIRL)>−90), more preferably within a range being larger than −90 degree and equal to or less than −80 degree (−80≥(θSL, θIRL)>−90).

The structure described above enables easy design enabling the magnetization energy ΔE_SL of the storage layer SL to be set larger than the magnetization energy ΔE_RL of the reference layer RL. This structure enables writing of two pieces of different data with a current of one direction, even in the case of applying a top-free type.

3.3 Others

The write operation of the magnetic storage device 1 described in each of the embodiments and the modifications thereof described above illustrates the case in which the controller 16 controls the voltage to supply current to the memory cell MC, but the structure is not limited thereto. For example, the controller 16 may execute a write operation by directly controlling the current to be caused to flow through the memory cell MC. In this case, specifically, in the first embodiment and the second embodiment, for example, the controller 16 may control the WC/RC 12 and the row decoder 13 such that the current Iw0 and the Iw1 are caused to flow through the memory cell MC, when data "0" and "1" are written, respectively. In addition, for example, in the modification, the controller 16 may control the WC/RC 12 and the row decoder 13 such that the periods in which a certain current is caused to flow through the memory cell MC when data "0" and "1" are written are the period D0 and D1, respectively.

Each of the embodiments and the modifications thereof described above illustrates the case in which the magnetoresistive element MTJ is a perpendicular magnetization MTJ, but the structure is not limited thereto. The magnetoresistive element MTJ may be a longitudinal magnetization MTJ element having longitudinal magnetic anisotropy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the invention.

What is claimed is:

1. A magnetic storage device comprising:
   a memory cell including:
      a magnetoresistive element;
      a selector electrically connected to the magnetoresistive element; and
      a first end electrically connected to a bit line, and a second end electrically connected to a word line,
   the magnetoresistive element including a first ferromagnetic layer, a second ferromagnetic layer, a third ferromagnetic layer, a first nonmagnetic layer disposed between the first ferromagnetic layer and the second ferromagnetic layer, and a second nonmagnetic layer disposed between the second ferromagnetic layer and the third ferromagnetic layer to couple the second ferromagnetic layer with the third ferromagnetic layer in an antiferromagnetic manner,
   the first ferromagnetic layer having a film thickness larger than a film thickness of the second ferromagnetic layer,
   the magnetoresistive element including a first end closer to the first ferromagnetic layer than to the second ferromagnetic layer, and a second end closer to the second ferromagnetic layer than to the first ferromagnetic layer, and
   an area of the first end of the magnetoresistive element being larger than an area of the second end of the magnetoresistive element.

2. The device of claim 1, wherein the first ferromagnetic layer has a volume larger than a volume of the second ferromagnetic layer.

3. The device of claim 1, wherein:
   the second ferromagnetic layer is disposed above the first ferromagnetic layer,
   the first end of the magnetoresistive element is a lower surface of the magnetoresistive element, and
   the second end of the magnetoresistive element is an upper surface of the magnetoresistive element.

4. The device of claim 1, wherein:
   the second ferromagnetic layer is disposed below the first ferromagnetic layer,
   the first end of the magnetoresistive element is an upper surface of the magnetoresistive element, and
   the second end of the magnetoresistive element is a lower surface of the magnetoresistive element.

5. The device of claim 1, wherein the selector includes one of an oxide-PN junction element, a metal-oxide Schottky diode element, a MIM (metal-insulator-metal) diode element, a MSM (metal-semiconductor-metal) diode element, and an OTS (ovonic threshold switch) element.

6. The device of claim 1, further comprising:
   a controller, wherein:
   the controller executes:
      a first operation of supplying a first voltage higher than a voltage of the second end of the memory cell to the first end of the memory cell, to write first data; and
      a second operation of supplying a second voltage different from the first voltage and higher than the voltage of the second end of the memory cell to the first end of the memory cell, to write second data different from the first data.

7. The device of claim 6, wherein the second voltage is higher than the first voltage.

8. The device of claim 6, wherein a pulse width of the second voltage is larger than a pulse width of the first voltage.

9. A magnetic storage device comprising:
a memory cell including:
a magnetoresistive element; and
a selector electrically connected to the magnetoresistive element, the magnetoresistive element including a first ferromagnetic layer, a second ferromagnetic layer, a third ferromagnetic layer, a first nonmagnetic layer disposed between the first ferromagnetic layer and the second ferromagnetic layer, and a second nonmagnetic layer disposed between the second ferromagnetic layer and the third ferromagnetic layer to couple the second ferromagnetic layer with the third ferromagnetic layer in an antiferromagnetic manner, and
the first ferromagnetic layer having magnetization energy larger than magnetization energy of the second ferromagnetic layer.

10. The device of claim 9, wherein the first ferromagnetic layer has a coercive force larger than a coercive force of the second ferromagnetic layer.

11. The device of claim 9, wherein the first ferromagnetic layer has saturated magnetization and a film thickness, product of which is larger than product of saturated magnetization and a film thickness of the second ferromagnetic layer.

12. The device of claim 9, wherein the first ferromagnetic layer has saturated magnetization larger than saturated magnetization of the second ferromagnetic layer.

13. The device of claim 9, wherein the first ferromagnetic layer has a film thickness larger than a film thickness of the second ferromagnetic layer.

14. The device of claim 9, wherein the first ferromagnetic layer has a volume larger than a volume of the second ferromagnetic layer.

15. A magnetic storage device comprising:
a memory cell including:
a magnetoresistive element;
a selector electrically connected to the magnetoresistive element; and
a first end electrically connected to a bit line, and a second end electrically connected to a word line,
the magnetoresistive element including a first ferromagnetic layer, a second ferromagnetic layer, a third ferromagnetic layer, a first nonmagnetic layer disposed between the first ferromagnetic layer and the second ferromagnetic layer, and a second nonmagnetic layer disposed between the second ferromagnetic layer and the third ferromagnetic layer to couple the second ferromagnetic layer with the third ferromagnetic layer in an antiferromagnetic manner,
the second ferromagnetic layer including:
a third nonmagnetic layer;
a fourth ferromagnetic layer disposed between the first nonmagnetic layer and the third nonmagnetic layer; and
a fifth ferromagnetic layer disposed between the second nonmagnetic layer and the third nonmagnetic layer, and
the first ferromagnetic layer having a film thickness larger than a film thickness of the fourth ferromagnetic layer.

16. The device of claim 15, wherein:
the third nonmagnetic layer couples the fourth ferromagnetic layer with the fifth ferromagnetic layer in a ferromagnetic manner, and
the first ferromagnetic layer has magnetization energy larger than magnetization energy of the fourth ferromagnetic layer.

17. The device of claim 15, wherein the first ferromagnetic layer has a volume larger than a volume of the fourth ferromagnetic layer.

18. The device of claim 15, wherein:
the second ferromagnetic layer is disposed above the first ferromagnetic layer, and
the magnetoresistive element has an upper surface with an area smaller than an area of a lower surface of the magnetoresistive element.

19. The device of claim 15, wherein:
the second ferromagnetic layer is disposed below the first ferromagnetic layer, and
the magnetoresistive element has an upper surface with an area larger than an area of a lower surface of the magnetoresistive element.

* * * * *